(12) United States Patent
Kim et al.

(10) Patent No.: US 11,127,364 B2
(45) Date of Patent: Sep. 21, 2021

(54) DISPLAY APPARATUS

(71) Applicant: LG Display Co., Ltd., Seoul (KR)

(72) Inventors: HongJae Kim, Paju-si (KR);
MoonSeok Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/711,142

(22) Filed: Dec. 11, 2019

(65) Prior Publication Data

US 2020/0211493 A1    Jul. 2, 2020

(30) Foreign Application Priority Data

Dec. 28, 2018    (KR) .................. 10-2018-0172573

(51) Int. Cl.
*G09G 3/36* (2006.01)
*G02F 1/1345* (2006.01)
(Continued)

(52) U.S. Cl.
CPC ......... *G09G 3/3677* (2013.01); *G02F 1/1368* (2013.01); *G02F 1/13452* (2013.01); *G09G 3/3266* (2013.01); *H01L 27/124* (2013.01); *G02F 1/133357* (2021.01); *G02F 1/136222* (2021.01); *G09G 2310/0205* (2013.01); (Continued)

(58) Field of Classification Search
CPC ............... G02F 1/13452; G02F 1/1368; G02F 2001/133357; G02F 2001/136222; G09G 2300/0426; G09G 2310/0205; G09G 2310/0286; G09G 2310/0289; G09G 2310/08; G09G 2320/0223; G09G 2320/0252; G09G 3/3266; G09G 3/3677; (Continued)

(56) References Cited

U.S. PATENT DOCUMENTS 10,102,793 B2    10/2018   Jang et al.
10,163,383 B2    12/2018   Lee
(Continued)

FOREIGN PATENT DOCUMENTS

CN    1920934 A    2/2007
CN    106328063 A    1/2017
(Continued)

OTHER PUBLICATIONS

European Patent Office, Extended European Search Report and Opinion, EP Patent Application No. 19217472.0, dated Apr. 21, 2020, eight pages.
(Continued)

*Primary Examiner* — Kenneth Bukowski
(74) *Attorney, Agent, or Firm* — Fenwick & West LLP

(57) ABSTRACT

Disclosed is a display apparatus. The display apparatus includes a substrate including a first substrate, including pixels connected to a plurality of gate lines, and first to fourth non-display areas surrounding the display area, a first gate driving circuit disposed in the second non-display area to drive a first gate line group among the plurality of gate lines, a second gate driving circuit disposed in the third non-display area to drive a second gate line group among the plurality of gate lines, and a third gate driving circuit disposed in the fourth non-display area to drive the first and second gate line groups.

26 Claims, 14 Drawing Sheets

(51) Int. Cl.
  *G02F 1/1368* (2006.01)
  *G09G 3/3266* (2016.01)
  *H01L 27/12* (2006.01)
  *H01L 27/32* (2006.01)
  *G02F 1/1333* (2006.01)
  *G02F 1/1362* (2006.01)
(52) U.S. Cl.
  CPC . *G09G 2310/08* (2013.01); *G09G 2320/0252* (2013.01); *H01L 27/1222* (2013.01); *H01L 27/1225* (2013.01); *H01L 27/3276* (2013.01)
(58) Field of Classification Search
  CPC ............. H01L 27/1222; H01L 27/1225; H01L 27/124; H01L 27/3276
  See application file for complete search history.

(56) References Cited

U.S. PATENT DOCUMENTS

| | | | |
|---|---|---|---|
| 10,360,854 B2 | 7/2019 | Kim et al. | |
| 11,024,258 B2 | 6/2021 | Jeong et al. | |
| 2011/0193478 A1* | 8/2011 | Kim | H05K 1/189 |
| | | | 315/32 |
| 2014/0043306 A1 | 2/2014 | Min et al. | |
| 2014/0168282 A1 | 6/2014 | Mun | |
| 2016/0225304 A1* | 8/2016 | Kim | G09G 3/2092 |
| 2017/0004760 A1 | 1/2017 | Jang et al. | |
| 2017/0046999 A1* | 2/2017 | Kim | G09G 3/3266 |
| 2017/0193893 A1 | 7/2017 | Lee | |
| 2017/0352328 A1 | 12/2017 | Jeong et al. | |
| 2018/0108677 A1* | 4/2018 | Yeh | H01L 27/1262 |
| 2018/0174519 A1* | 6/2018 | Kim | H01L 33/42 |
| 2018/0366066 A1 | 12/2018 | Kim et al. | |

FOREIGN PATENT DOCUMENTS

| | | |
|---|---|---|
| CN | 106935214 A | 7/2017 |
| CN | 107452313 A | 12/2017 |
| CN | 109087608 A | 12/2018 |
| KR | 10-2015-0059005 A | 5/2015 |
| KR | 10-2016-0044173 A | 4/2016 |

OTHER PUBLICATIONS

China National Intellectual Property Administration, Office Action, CN Patent Application No. 201911256350.3, dated Jul. 26, 2021, 17 pages.

* cited by examiner

DISPLAY APPARATUS

CROSS-REFERENCE TO RELATED APPLICATION

This application claims priority to Republic of Korea Patent Application No. 10-2018-0172573, filed on Dec. 28, 2018, which is incorporated herein by reference in its entirety.

BACKGROUND

Field of Technology

The present disclosure relates to a display apparatus.

Discussion of the Related Art

Display apparatuses are being widely used as display screens of notebook computers, tablet computers, smartphones, portable display apparatuses, and portable information devices in addition to display apparatuses of televisions (TVs) and monitors. Examples of the display apparatuses include liquid crystal display (LCD) apparatuses and light emitting display apparatuses. Since the light emitting display apparatuses display an image by using a self-emitting device, the light emitting display apparatuses have a fast response time, low power consumption, and a good viewing angle, and thus, are attracting much attention as next-generation display apparatuses.

The display apparatuses may each include a gate driver which supplies a gate pulse to a plurality of gate lines, and by using a shift register, the gate driver may sequentially shift the gate pulse applied to the plurality of gate lines. Also, when the shift register and a pixel array are provided on a substrate of a display panel, the display apparatuses may each have a gate-in panel (GIP) structure.

In a related art display apparatus, since the shift register is disposed in each of a left bezel area and a right bezel area of the substrate, the gate pulse may be supplied through a double feeding method or an interlacing method. In the case of the double feeding method, a problem may arise where a design area of the shift register increases the left bezel area and the right bezel area. In the case of the interlacing method being applied to a large display panel, a problem may arise where the delay of the gate pulse increases as the distance from an input terminal to which the gate pulse is input increases.

SUMMARY

Accordingly, the present disclosure is directed to providing a display apparatus that substantially obviates one or more problems due to limitations and disadvantages of the related art.

An aspect of the present disclosure is directed to providing a display apparatus in which a gate driving circuit is disposed in a non-display area provided in each of three sides except a pad part, and thus, a left bezel area and a right bezel area are reduced and the delay of a gate pulse is prevented, thereby easily realizing high speed driving.

Another aspect of the present disclosure is directed to providing a display apparatus in which a gate driving circuit is individually disposed in each of second to fourth non-display areas except a first non-display area with a pad part provided therein, and thus, an area of each of the second and third non-display areas is reduced and an output difference between gate pulses is prevented from occurring in a display area.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display area, including a pixel connected to a plurality of gate lines, and first to fourth non-display areas surrounding the display area, a pad part disposed in the first non-display area, a first gate driving circuit disposed in the second non-display area to drive a first gate line group among the plurality of gate lines, a second gate driving circuit disposed in the third non-display area to drive a second gate line group among the plurality of gate lines, and a third gate driving circuit disposed in the fourth non-display area to drive the first and second gate line groups.

Details of other embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure.

DETAILED DESCRIPTION

Figure 1:
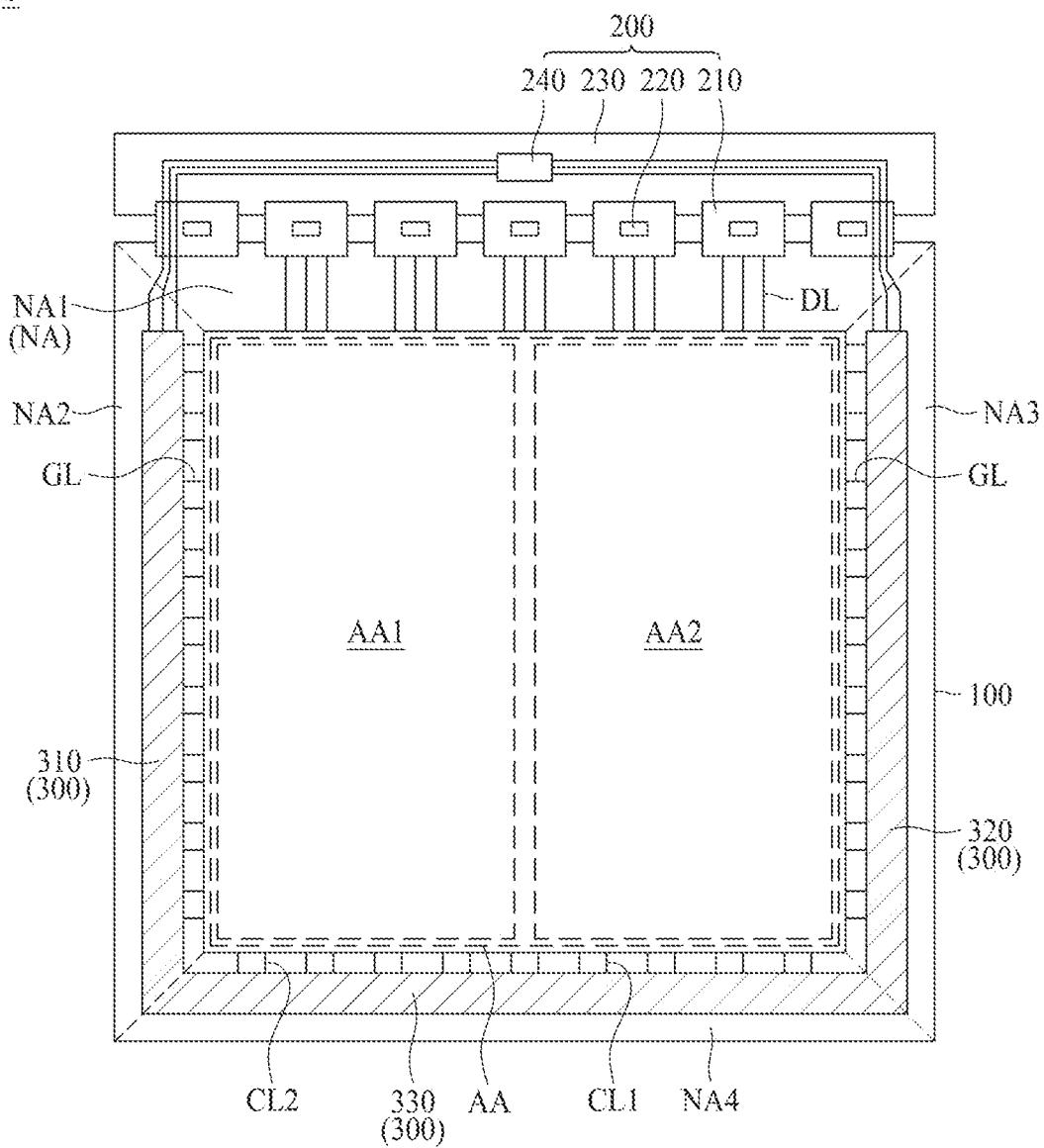
FIG. 1 is a plan view illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of a relevant known function or configuration is determined to unnecessarily obscure the important aspects of the present disclosure, the detailed description thereof will be omitted. In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus according to the present disclosure will be described in detail with reference to the accompanying drawings, by taking a light emitting display apparatus as an example, but the present disclosure is not limited thereto. In adding reference numerals to elements of each of the drawings, although the same elements are illustrated in other drawings, like reference numerals may refer to like elements.

Figure 2:
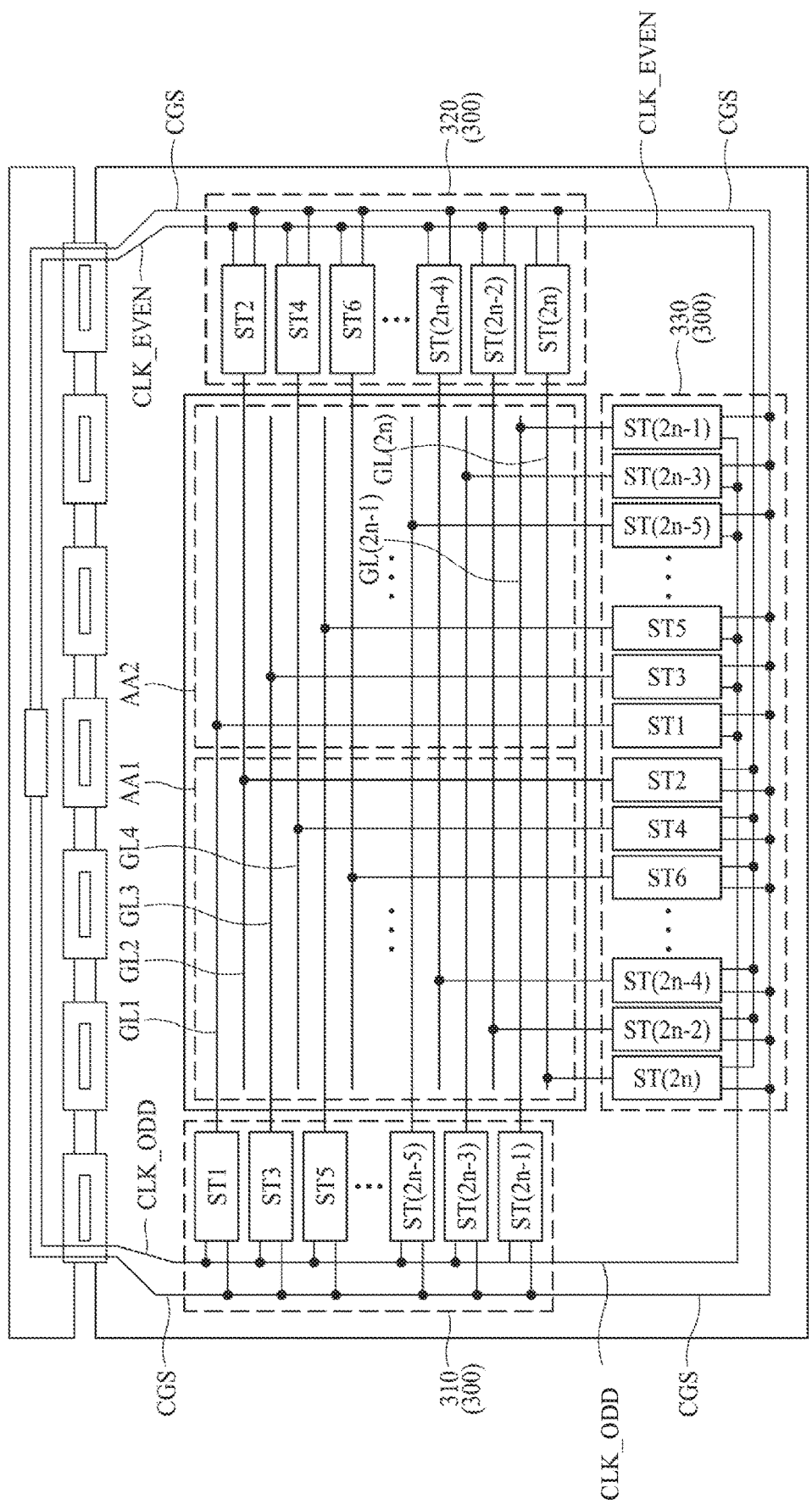
FIG. 2 is a diagram illustrating a connection relationship between a plurality of stages and a plurality of gate lines in a display apparatus according to an embodiment.

FIG. 1 is a plan view illustrating a display apparatus 10 according to an embodiment of the present disclosure, and FIG. 2 is a diagram illustrating a connection relationship between a plurality of stages and a plurality of gate lines in a display apparatus according to an embodiment.

Referring to FIGS. 1 and 2, the display apparatus 10 may include a display panel 100, a display driver 200, and a gate driver 300.

The display panel 100 may include a display area AA and a non-display area NA. The display panel 100 may be a liquid crystal display panel or an organic light emitting display panel, but is not limited thereto and may be various kinds of panels.

When the display panel 100 is a liquid crystal display panel, a color filter for realizing a color may be provided in an upper substrate, and a liquid crystal may be disposed between the upper substrate and a thin film transistor (TFT) substrate including a TFT.

However, the color filter may be provided in a planarization layer which covers the TFT. For example, the TFT may be provided in the TFT substrate, the planarization layer may be provided on the TFT so as to remove a step difference of the TFT, a pixel electrode may be provided on the planarization layer, and a liquid crystal layer may be provided on the planarization layer and the pixel electrode. In this case, the planarization layer may be configured with at least two layers, and one of the at least two layers may be used as a color filter. For example, the color filter may be provided on the TFT, and the planarization layer may be provided on the color filter. In another example, the color filter may be disposed over the TFT with an insulation layer interposed therebetween. In this case, since a color filter is not provided in the upper substrate, a process of manufacturing the upper substrate and a structure of the upper substrate may be simplified. In another example, the TFT may be disposed on the display area and may include a gate electrode, an active layer, a source electrode and a drain electrode. The active layer of the TFT may include one of oxide semiconductor layer, amorphous silicon semiconductor layer, and polycrystalline semiconductor layer.

The display area AA may be an area which displays an image and may be defined in a center portion of each substrate. Here, the display area AA may correspond to an active area of a pixel array layer. For example, the display area AA may include a plurality of pixels (not shown) which are respectively provided in a plurality of pixel areas defined by intersections of a plurality of data lines DL and a plurality of gate lines GL. Here, each of the plurality of pixels may be defined as a minimum-unit area which emits light.

The display area AA may include a first display area AA1 and a second display area AA2.

The first display area AA1 may correspond to a left area of the display area AA and may be adjacent to a first gate driving circuit 310. For example, one end (for example, a left end) of the first display area AA1 may face the first gate driving circuit 310, and the other end (for example, a lower end) perpendicular to the one end of the first display area AA1 may face even stages ST2 to ST(2n) (where n is a natural number equal to or more than four) of a third gate driving circuit 330. Therefore, one end of each of odd gate lines GL1 to GL(2n−1) (where n is a natural number equal to or more than four) disposed in the first display area AA1 may be connected to the first gate driving circuit 310 and may receive a gate pulse, and even gate lines GL2 to GL(2n) (where n is a natural number equal to or more than four) disposed in the first display area AA1 may be connected to even stages ST2 to ST(2n) of the third gate driving circuit 330 through the second connection line CL2 and may receive the gate pulse.

The connection lines and the gate lines may be provided on different layers with an insulation layer therebetween. In this case, each of the connection lines and one gate line corresponding thereto may be electrically connected to each other through a contact hole.

When the display panel 100 is a liquid crystal display panel, the connection lines may be provided in the TFT substrate through the same process as one of TFTs included in each pixel and metals included in the pixel electrode.

However, when the display panel 100 is a liquid crystal display panel, the connection lines may also be provided in the TFT substrate and may be covered by the insulation layer, and the TFTs may be provided on the insulation layer. That is, the connection lines may be provided under the TFTs so as to be insulated from the TFTs. In this case, since a parasitic capacitance does not occur in the connection lines and the TFTs, the driving efficiency of the TFTs may be enhanced, and a load of each of the TFTs may decrease. In another example, the connection lines may be disposed on one of the planarization layer and the color filter.

The second display area AA2 may correspond to a right area of the display area AA and may be adjacent to a second gate driving circuit 320. For example, one end (for example, a right end) of the second display area AA2 may face the second gate driving circuit 320, and the other end (for example, a lower end) perpendicular to the one end of the second display area AA2 may face odd stages ST1 to ST(2n−1) (where n is a natural number equal to or more than four) of the third gate driving circuit 330. Therefore, one end of each of even gate lines GL2 to GL(2n) disposed in the second display area AA2 may be connected to the second gate driving circuit 320 and may receive the gate pulse, and odd gate lines GL1 to GL(2n−1) disposed in the second display area AA2 may be connected to odd stages ST1 to ST(2n−1) of the third gate driving circuit 330 through the first connection line CL1 and may receive the gate pulse.

The non-display area NA may be an area which does not display an image and may be defined in an edge portion of each substrate surrounding the display area AA. Also, the non-display area NA may include first to fourth non-display areas NA1 to NA4 facing an upper end, a left end, a right end, and a lower end of the display area AA.

The first non-display area NA1 may be disposed on the upper end of the display area AA and may be connected to the display driver 200, and moreover, may include a pad part (not shown) electrically connected to the display driver 200. For example, the pad part of the first non-display area NA1 may be connected to a plurality of circuit films 210 of the display driver 200.

The second non-display area NA2 may be disposed in the left end of the display area AA and may accommodate the first gate driving circuit 310. In detail, the second non-display area NA2 may accommodate the odd stages ST1 to ST(2n−1) of the first gate driving circuit 310. Here, the odd stages ST1 to ST(2n−1) may correspond to odd-numbered stages ST1 to ST(2n−1) of a plurality of stages. Also, the second non-display area NA2 may accommodate one end of each of the odd gate lines GL1 to GL(2n−1) or a first gate line group connected to the odd stages ST1 to ST(2n−1) of the first gate driving circuit 310. Also, the second non-display area NA2 may accommodate a common signal line CGS and an odd clock line CLK_ODD extending from the display driver 200, each connected to the first gate driving circuit 310.

The third non-display area NA3 may be disposed in the right end of the display area AA and may accommodate the second gate driving circuit 320. In detail, the third non-display area NA3 may accommodate the even stages ST2 to ST(2n) of the second gate driving circuit 320. Here, the even stages ST2 to ST(2n) may correspond to even-numbered stages ST2 to ST(2n) of the plurality of stages. Also, the third non-display area NA3 may accommodate one end of each of the even gate lines GL2 to GL(2n) or a second gate line group connected to the even stages ST2 to ST(2n) of the second gate driving circuit 320. Also, the third non-display area NA3 may accommodate the common signal line CGS and an even clock line CLK_EVEN extending from the display driver 200, each connected to the second gate driving circuit 320.

The fourth non-display area NA4 may be disposed in the lower end of the display area AA and may accommodate the third gate driving circuit 330. In detail, the fourth non-display area NA4 may accommodate the odd stages ST1 to ST(2n−1) and the even stages ST2 to ST(2n) of the third gate driving circuit 330. Also, the fourth non-display area NA4 may accommodate one end of the first connection line CL1 connected to the odd gate lines GL1 to GL(2n−1) and one end of the second connection line CL2 connected to the even gate lines GL2 to GL(2n). Also, the fourth non-display area NA4 may accommodate the common signal line CGS, the odd clock line CLK_ODD, and the even clock line CLK_EVEN extending from the second or third non-display area NA2 or NA3, each connected to the third gate driving circuit 330.

The display panel 100 may further include the plurality of gate lines, the plurality of data lines DL, and the first and second connection lines CL1 and CL2. A length of each of the first connection line CL1 and the second connection line CL2 may be gradually decreased from a middle portion to an edge portion of the third gate driving circuit 330 in the TFT substrate The plurality of gate lines GL may extend in a first direction and may be spaced apart from one another in a second direction intersecting the first direction. In detail, the plurality of gate lines GL may include a first gate line group GL1 to GL(2n−1) and a second gate line group GL2 to GL(2n). Here, the first gate line group may include the odd gate lines GL1 to GL(2n−1), which are odd-numbered gate lines, of the plurality of gate lines GL, and the second gate line group may include the even gate lines GL2 to GL(2n), which are even-numbered gate lines, of the plurality of gate lines GL. The plurality of gate lines GL may receive the gate pulse from the gate driver 300 and may sequentially drive the plurality of pixels.

According to an embodiment, one end of each of the odd gate lines GL1 to GL(2n−1) may be directly connected to the first gate driving circuit 310 and may receive the gate pulse, and the odd gate lines GL1 to GL(2n−1) may be connected to the first connection line CL1 in the second display area AA2 and may receive the gate pulse from the odd stages ST1 to ST(2n−1) of the third gate driving circuit 330.

According to an embodiment, one end of each of the even gate lines GL2 to GL(2n) may be directly connected to the second gate driving circuit 320 and may receive the gate pulse, and the even gate lines GL2 to GL(2n) may be connected to the second connection line CL2 in the first display area AA1 and may receive the gate pulse from the even stages ST2 to ST(2n) of the third gate driving circuit 330.

The plurality of data lines DL may extend in the second direction and may be spaced apart from one another in the first direction. Each of the plurality of data lines DL may receive a data voltage from the display driver 200 to control luminance of a light emitting device included in a corresponding pixel of the plurality of pixels.

The first connection line CL1 may be provided in plurality, and the plurality of first connection lines CL1 may extend in the second direction and may be spaced apart from one another in the first direction. The plurality of first connection lines CL1 may be directly connected to the odd stages ST1 to ST(2n−1) of the third gate driving circuit 330 and may extend to the second display area AA2. Therefore, the first connection line CL1 may connect points of the odd gate lines GL1 to GL(2n−1) of the second display area AA2 to the odd stages ST1 to ST(2n−1) of the third gate driving circuit 330.

The second connection line CL2 may be provided in plurality, and the plurality of second connection lines CL2 may extend in the second direction and may be spaced apart from one another in the first direction. The plurality of second connection lines CL2 may be directly connected to the even stages ST2 to ST(2n) of the third gate driving circuit 330 and may extend to the first display area AA1. Therefore, the second connection line CL2 may connect points of the even gate lines GL2 to GL(2n) of the first display area AA1 to the even stages ST2 to ST(2n) of the third gate driving circuit 330.

Each of the plurality of pixels may be provided in a corresponding pixel area defined by a corresponding gate line GL and a corresponding data line DL each disposed in the display area AA. According to an embodiment, each of the plurality of pixels may include a pixel circuit including a driving transistor and a light emitting device connected to the pixel circuit.

The display driver 200 may be connected to the pad part provided in the non-display area NA of the display panel 100 and may display an image, corresponding to video data supplied from a display driving system, on each pixel.

According to an embodiment, the display driver 200 may include a plurality of circuit films 210, a plurality of data driving integrated circuits (ICs) 220, a printed circuit board (PCB) 230, and a timing controller 240.

Input terminals provided in one side of each of the plurality of circuit films 210 may be attached on the PCB 230 through a film attachment process, and output terminals provided in the other side of each of the plurality of circuit films 210 may be attached on the pad part through a film attachment process. According to an embodiment, each of the plurality of circuit films 210 may be implemented as a flexible circuit film so as to decrease a bezel area of the display apparatus 10 and may be bent. For example, the plurality of circuit films 210 may each be configured as a tape carrier package (TCP) or a chip-on film (or a chip-on film board) (COF).

Each of the plurality of data driving ICs 220 may be individually mounted on a corresponding circuit film of the plurality of circuit films 210. Each of the plurality of data driving ICs 220 may receive a data control signal and pixel data each provided from the timing controller 240, convert the pixel data into a pixel-based analog data signal according to the data control signal, and supply the analog data signal to a corresponding data line.

The PCB 230 may support the timing controller 240 and may transfer signals and power between the elements of the display driver 200. The PCB 230 may provide a signal and a driving power, each supplied from the timing controller 240, to the data driving ICs 220 and a plurality of scan driving circuit units so as to display image on each pixel. To this end, a signal transfer line and various power lines may be provided on the PCB 230. For example, the PCB 230 may be provided as one or more, based on the number of circuit films 210.

The timing controller 240 may be mounted on the PCB 230 and may receive, through a user connector provided on the PCB 230, the video data and a timing synchronization signal each supplied from the display driving system. The timing controller 240 may align the video data to generate pixel data matching a pixel arrangement structure, based on the timing synchronization signal and may supply the generated pixel data to a corresponding data driving IC 220. Also, the timing controller 240 may generate the data control signal and a gate control signal on the basis of the timing synchronization signal, control a driving timing of each of the plurality of data driving ICs 220 by using the data control signal, and control a driving timing of the gate driver 300 by using the gate control signal. Here, the gate control signal may be supplied to the gate diver 300 through the first non-display area NA1 and first and/or last circuit film of the plurality of circuit films 210. However, although FIGS. 1 and 2 show a detailed structure and configuration of the display driver 200, it is to be noted that the embodiments of the present disclosure are not limited thereto, and various other structures and configurations of the display driver may also be applied in the display apparatus of the present disclosure.

The gate driver 300 may be connected to the plurality of gate lines GL provided in the display panel 100. In detail, the gate driver 300 may generate the gate pulse in a predetermined order, based on the gate control signal supplied from the timing controller 240 and may supply the gate pulse to a corresponding gate line GL. According to an embodiment, the gate driver 300 may include the first to third gate driving circuits 310 to 330.

The first gate driving circuit 310 may include the odd stages ST1 to ST(2n−1) respectively corresponding to the odd gate lines GL1 to GL(2n−1). In detail, the first gate driving circuit 310 may be integrated into a left edge (or the second non-display area NA2) of the display panel 100 through a process of manufacturing the TFT and may be connected to the odd gate lines GL1 to GL(2n−1). According to an embodiment, the first gate driving circuit 310 may include the odd stages ST1 to ST(2n−1) which are disposed in the second non-display area NA2 and respectively provide the gate pulse to the odd gate lines GL1 to GL(2n−1).

The second gate driving circuit 320 may include the even stages ST2 to ST(2n) respectively corresponding to the even gate lines GL2 to GL(2n). In detail, the second gate driving circuit 320 may be integrated into a right edge (or the third non-display area NA3) of the display panel 100 through a process of manufacturing the TFT and may be connected to the even gate lines GL2 to GL(2n). According to an embodiment, the second gate driving circuit 320 may include the even stages ST2 to ST(2n) which are disposed in the third non-display area NA3 and respectively provide the gate pulse to the even gate lines GL2 to GL(2n).

The third gate driving circuit 330 may include the odd stages ST1 to ST(2n−1) respectively corresponding to the odd gate lines GL1 to GL(2n−1) and the even stages ST2 to ST(2n) respectively corresponding to the even gate lines GL2 to GL(2n). In detail, the third gate driving circuit 330 may be integrated into a lower edge (or the fourth non-display area NA4) of the display panel 100 through a process of manufacturing the TFT and may be connected to the plurality of first connection lines CL1 and the plurality of second connection lines CL2. For example, the odd stages ST1 to ST(2n−1) of the third gate driving circuit 330 may be respectively connected to the odd gate lines GL1 to GL(2n−1) through the first connection line CL1, and the even stages ST2 to ST(2n) of the third gate driving circuit 330 may be respectively connected to the even gate lines GL2 to GL(2n) through the second connection line CL2.

Figure 3:
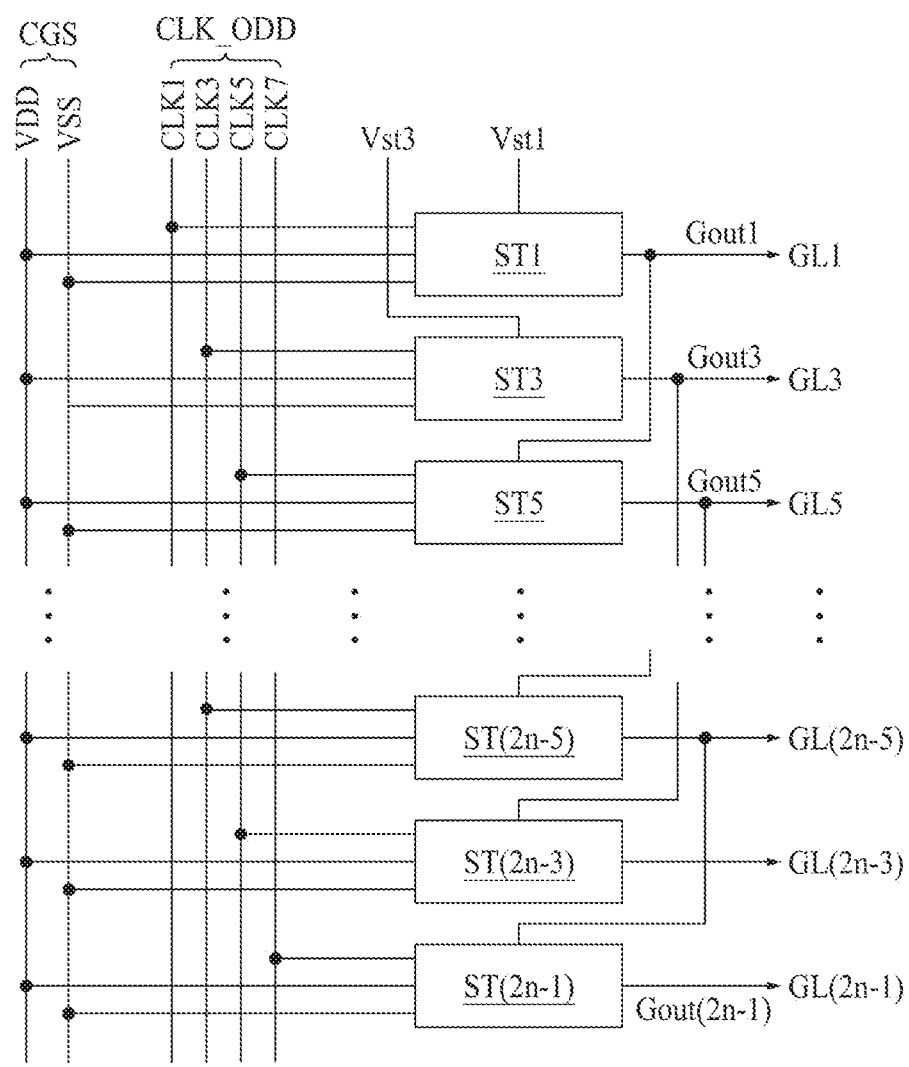
FIG. 3 is a diagram illustrating a first gate driving circuit in the display apparatus illustrated in FIG. 2 according to an embodiment.

FIG. 3 is a diagram illustrating a first gate driving circuit in the display apparatus illustrated in FIG. 2.

Referring to FIG. 3, a first gate driving circuit 310 may include odd stages ST1 to ST(2n−1) which supply a gate pulse to odd gate lines GL1 to GL(2n−1). That is, the first gate driving circuit 310 may include the odd stages ST1 to ST(2n−1) corresponding to the total number of odd gate lines GL1 to GL(2n−1). In detail, the first gate driving circuit 310 may be supplied with first and second driving voltages VDD and VSS through a common signal line CGS passing through a second non-display area NA2 and may receive an odd clock signal through an odd clock line CLK_ODD. Here, the odd clock signal may correspond to first, third, fifth, and seventh gate clocks CLK1, CLK3, CLK5, and CLK7. Also, each of the first, third, fifth, and seventh gate clocks CLK1, CLK3, CLK5, and CLK7 may have a phase which is sequentially shifted. In this case, the odd clock line CLK_ODD may transfer the first gate clock CLK1 to a $2k-3^{th}$ stage ST(2k−7) (where k is a multiple of 4 equal to or less than n), transfer the third gate clock CLK3 to a $2k-5^{th}$ stage ST(2k−5), transfer the fifth gate clock CLK5 to a $2k-3^{th}$ stage ST(2k−3), and transfer the seventh gate clock CLK7 to a $2k-1^{th}$ stage ST(2k−1).

The first and third stages ST1 and ST3 may be respectively enabled by first and third gate start signals Vst1 and Vst3 and may respectively receive the first and third gate clocks CLK1 and CLK3 to respectively supply gate pulses Gout1 and Gout3 to the first and third gate lines GL1 and GL3. Also, the first and third stages ST1 and ST3 may be respectively reset by output signals (or gate pulses) Gout5 and Gout7 of the fifth and seventh stages ST5 and ST7.

In this manner, the fifth to $2n-5^{th}$ stages ST5 to ST(2n−5) of the odd stages ST1 to ST(2n−1) may be enabled by an output signal of a previous fourth stage (e.g., the fourth stage immediately preceding the respective stage) and may respectively receive corresponding gate clocks of the gate clocks CLK1, CLK3, CLK5, and CLK7 to supply gate pulses Gout5 and Gout(2n−5) to the odd gate lines GL5 to GL(2n−5). Also, the fifth to $2n-5^{th}$ stages ST5 to ST(2n−5) may be reset by an output signal of a next fourth stage (e.g., the fourth stage immediately following the respective stage).

Moreover, the $2n-3^{th}$ and $2n-1^{th}$ stages ST(2n−3) and ST(2n−1) may be enabled by an output signal of a previous fourth stage and may respectively receive the gate clocks CLK5 and CLK7 corresponding thereto to respectively supply gate pulses Gout(2n−3) and Gout(2n−1) to the $2n-3^{th}$ and $2n-1^{th}$ gate lines GL(2n−3) and GL(2n−1). Also, the $2n-3^{th}$ and $2n-1^{th}$ stages ST(2n−3) and ST(2n−1) may be reset by first and third reset clocks (not shown).

In this manner, each of output signals Gout1 to Gout(2n−5) of the first to $2n-5^{th}$ stages ST1 and ST(2n−5) may be supplied as a gate start signal of a next fourth stage, and each of output signals Gout5 to Gout(2n−1) of the fifth to $2n-1^{th}$ stages ST5 and ST(2n−1) may be supplied as a reset clock of a previous fourth stage.

Figure 4:
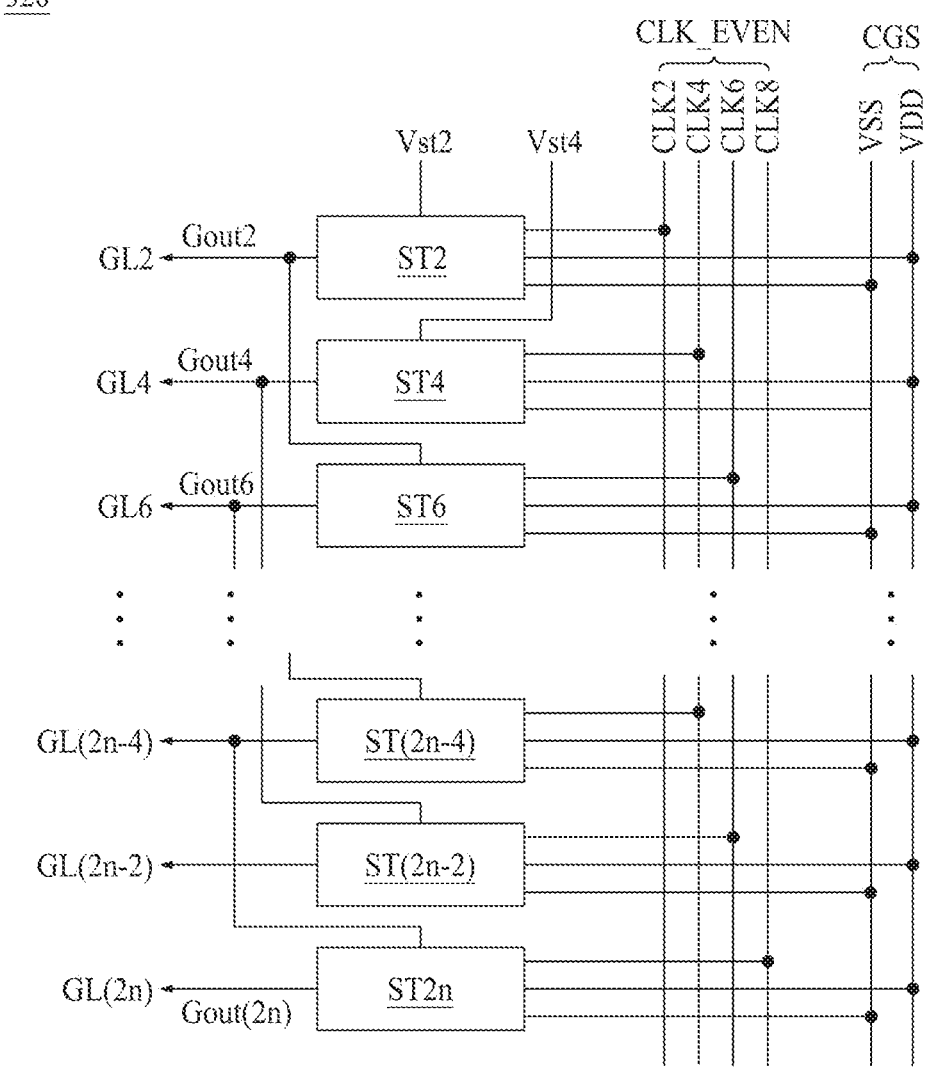
FIG. 4 is a diagram illustrating a second gate driving circuit in the display apparatus illustrated in FIG. 2 according to an embodiment.

FIG. 4 is a diagram illustrating a second gate driving circuit in the display apparatus illustrated in FIG. 2.

Referring to FIG. 4, a second gate driving circuit 320 may include even stages ST2 to ST(2n) which supply a gate pulse to even gate lines GL2 to GL(2n). That is, the second gate driving circuit 320 may include the even stages ST2 to ST(2n) corresponding to the total number of even gate lines GL2 to GL(2n). In detail, the second gate driving circuit 320 may be supplied with first and second driving voltages VDD and VSS through a common signal line CGS passing through a third non-display area NA3 and may receive an even clock signal through an even clock line CLK_EVEN. Here, the even clock signal may correspond to second, fourth, sixth, and eighth gate clocks CLK2, CLK4, CLK6, and CLK8. Also, each of the second, fourth, sixth, and eighth gate clocks CLK2, CLK4, CLK6, and CLK8 may have a phase which is sequentially shifted. In this case, the even clock line CLK_EVEN may transfer the second gate clock CLK2 to a $2k-6^{th}$ stage ST(2k−6) (where k is a multiple of 4 equal to or less than n), transfer the fourth gate clock CLK4 to a $2k-4^{th}$ stage ST(2k−4), transfer the sixth gate clock CLK6 to a 2k−2th stage ST(2k−2), and transfer the eighth gate clock CLK8 to a $2k^{th}$ stage ST(2k).

The second and fourth stages ST2 and ST4 may be respectively enabled by second and fourth gate start signals Vst2 and Vst4 and may respectively receive the second and fourth gate clocks CLK2 and CLK4 to respectively supply gate pulses Gout2 and Gout4 to the second and fourth gate lines GL2 and GL4. Also, the second and fourth stages ST2 and ST4 may be respectively reset by output signals (or gate pulses) Gout6 and Gout8 of the sixth and eighth stages ST6 and ST8.

In this manner, the sixth to $2n-4^{th}$ stages ST6 to ST(2n−4) of the odd stages ST1 to ST(2n−1) may be enabled by an output signal of a previous fourth stage and may respectively receive corresponding gate clocks of the gate clocks CLK2, CLK4, CLK6, and CLK8 to supply gate pulses Gout6 and Gout(2n−4) to the odd gate lines GL6 to GL(2n−4). Also, the sixth to $2n-4^{th}$ stages ST6 to ST(2n−4) may be reset by an output signal of a next fourth stage.

Moreover, the $2n-2^{th}$ and $2n^{th}$ stages ST(2n−2) and ST(2n) may be enabled by an output signal of a previous fourth stage and may respectively receive the gate clocks CLK6 and CLK8 corresponding thereto to respectively supply gate pulses Gout(2n−2) and Gout(2n) to the 2n−2$^{th}$ and 2n$^{th}$ gate lines GL(2n−2) and GL(2n). Also, the 2n−2$^{th}$ and 2n$^{th}$ stages ST(2n−2) and ST(2n) may be reset by second and fourth reset clocks (not shown).

In this manner, each of output signals Gout2 to Gout(2n−4) of the second to 2n−4$^{th}$ stages ST2 to ST(2n−4) may be supplied as a gate start signal of a next fourth stage, and each of output signals Gout6 to Gout(2n) of the sixth to 2$^{th}$ stages ST6 and ST(2n) may be supplied as a reset clock of a previous fourth stage.

Figure 5:
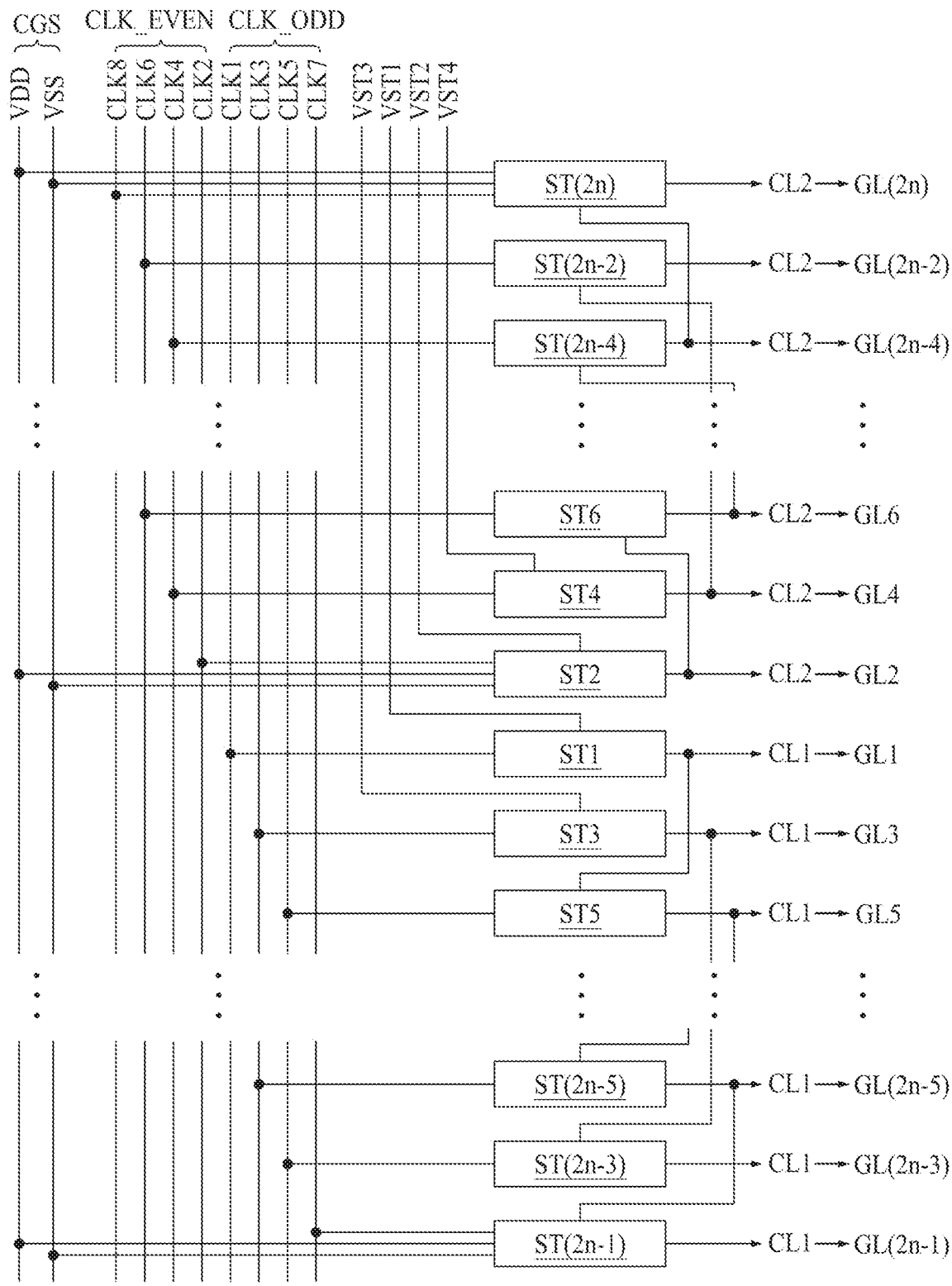
FIG. 5 is a diagram illustrating a third gate driving circuit in the display apparatus illustrated in FIG. 2 according to an embodiment.

FIG. 5 is a diagram illustrating a third gate driving circuit in the display apparatus illustrated in FIG. 2.

Referring to FIG. 5, a third gate driving circuit 330 may include odd stages ST1 to ST(2n−1) which supply a gate pulse to odd gate lines GL1 to GL(2n−1) through a first connection line CL1 and may include even stages ST2 to ST(2n) which supply the gate pulse to even gate lines GL2 to GL(2n) through a second connection line CL2.

That is, the third gate driving circuit 330 may include the odd stages ST1 to ST(2n−1) corresponding to the total number of odd gate lines GL1 to GL(2n−1) and the even stages ST2 to ST(2n) corresponding to the total number of even gate lines GL2 to GL(2n). In detail, the third gate driving circuit 330 may receive first and second driving voltages VDD and VSS through a common signal line CGS passing through a fourth non-display area NA4, receive first, third, fifth, and seventh gate clocks CLK1, CLK3, CLK5, and CLK7 through an odd clock line CLK_ODD, and receive second, fourth, sixth, and eighth gate clocks CLK2, CLK4, CLK6, and CLK8 through an even clock line CLK_EVEN. Here, each of the first to eighth gate clocks CLK1 to CLK8 may have a phase which is sequentially shifted. In this case, the odd clock line CLK_ODD may transfer the first, third, fifth, and seventh gate clocks CLK1, CLK3, CLK5, and CLK7 to the odd stages ST1 to ST(2n−1), and the even clock line CLK_EVEN may transfer the second, fourth, sixth, and eighth gate clocks CLK2, CLK4, CLK6, and CLK8 to the even stages ST2 to ST(2n).

The odd stages ST1 to ST(2n−1) of the third gate driving circuit 330 may generate the same output signals Gout1 to Gout(2n−1) at the same timing as the odd stages ST1 to ST(2n−1) of the first gate driving circuit 310.

According to an embodiment, the odd stages ST1 to ST(2n−1) of the third gate driving circuit 330 may be connected to points of the odd gate lines GL1 to GL(2n−1) of the second display area AA2 through the first connection line CL1. Therefore, the odd stages ST1 to ST(2n−1) of the third gate driving circuit 330 may provide output signals Gout1 to Gout(2n−1) to the odd gate lines GL1 to GL(2n−1) of the second display area AA2 through the first connection line CL1.

The even stages ST2 to ST(2n) of the third gate driving circuit 330 may generate the same output signals Gout2 to Gout(2n) at the same timing as the even stages ST2 to ST(2n) of the second gate driving circuit 320.

According to an embodiment, the even stages ST2 to ST(2n) of the third gate driving circuit 330 may be connected to points of the even gate lines GL2 to GL(2n) of the first display area AA1 through the second connection line CL2. Therefore, the even stages ST2 to ST(2n) of the third gate driving circuit 330 may provide output signals Gout2 to Gout(2n) to the even gate lines GL2 to GL(2n) of the first display area AA1 through the second connection line CL2.

Figure 6:
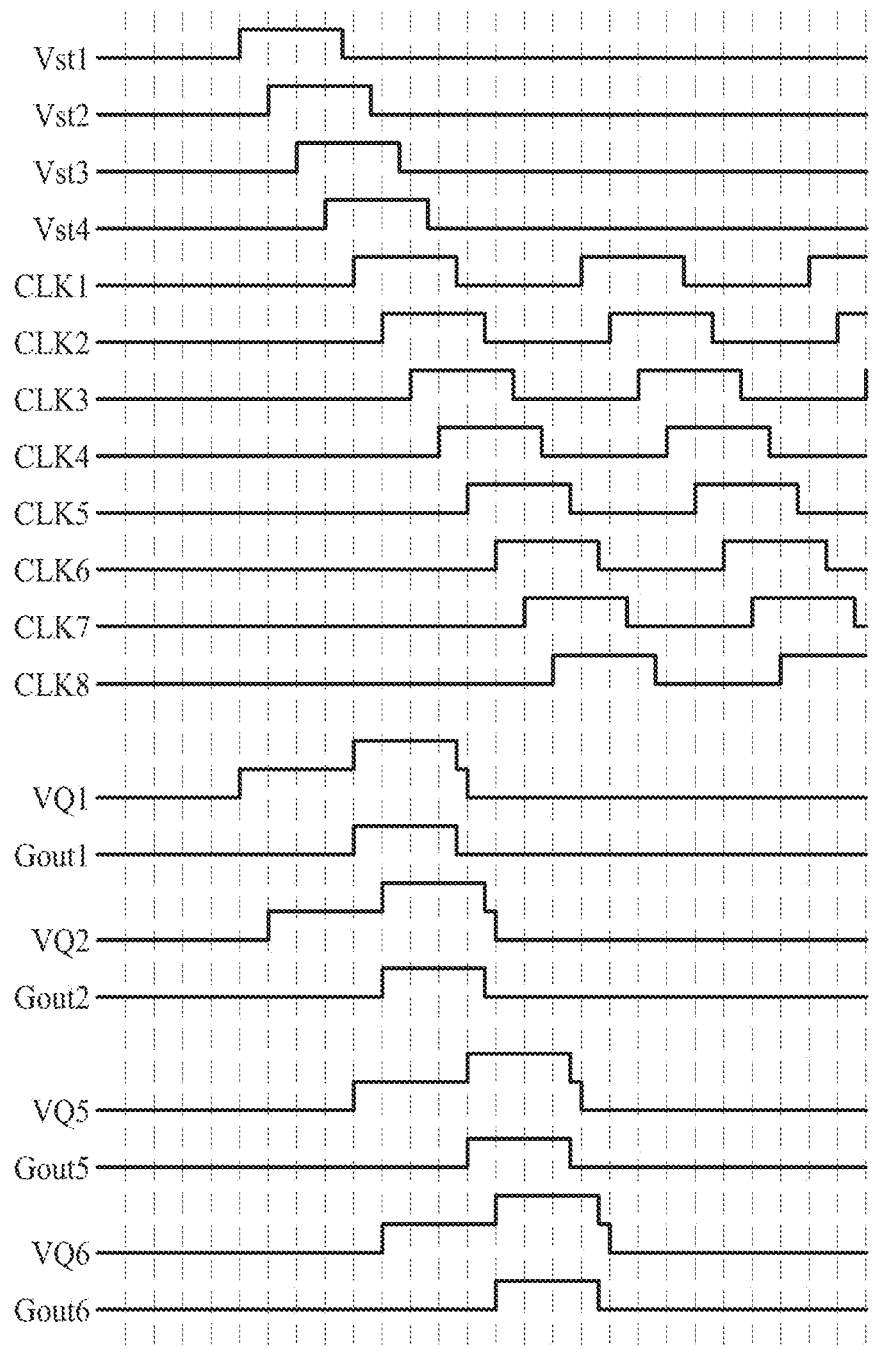
FIG. 6 is a waveform diagram showing a gate start signal, a gate shift clock, and a common gate signal in the display apparatus illustrated in FIG. 2.
Figure 7:
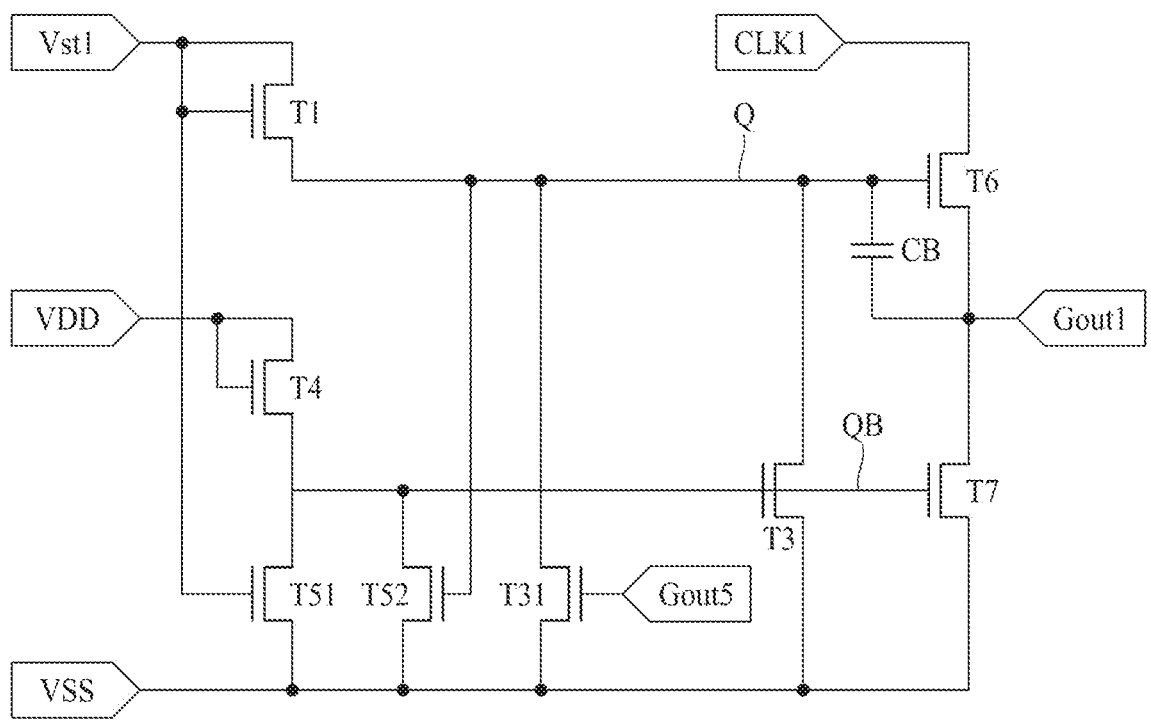
FIG. 7 is a circuit diagram illustrating an internal configuration of a first stage illustrated in FIG. 3 according to an embodiment.

FIG. 6 is a waveform diagram showing a gate start signal, a gate shift clock, and a common gate signal in the display apparatus illustrated in FIG. 2. FIG. 7 is a circuit diagram illustrating an internal configuration of a first stage illustrated in FIG. 3.

Referring to FIGS. 6 and 7, a first stage ST1 may include a first TFT T1, a third TFT T3, a thirty-first TFT T31, a fourth TFT T4, a fifty-first TFT T51, a fifty-second TFT T52, a sixth TFT T6, a seventh TFT T7, and a boot capacitor CB.

The first TFT T1 may include a gate terminal which receives a first gate start signal Vst1, a first terminal which receives the first gate start signal Vst1, and a second terminal connected to a first node Q. That is, the first TFT T1 may be turned on based on the first gate start signal Vst1 and may provide the first gate start signal Vst1 to the first node Q. Here, the first node Q may be connected to a gate terminal of the sixth TFT T6, and the first stage ST1 may provide an output signal (or a gate pulse) Gout1 to a first gate line GL1 on the basis of a voltage of the first node Q. Also, the output signal Gout1 may be supplied as a gate start signal of a next fourth stage.

According to an embodiment, first TFTs T1 of second to fourth stages ST2 to ST4 may be turned on based on second to fourth gate start signals Vst2 to Vst4, respectively, and the second to fourth stages ST2 to ST4 may respectively provide the second to fourth gate start signals Vst2 to Vst4 to first nodes Q. Also, a first TFT T1 of an stage STi (where i is a natural number from five to 2n) may be turned on based on an output signal Gout(i−4) of a previous fourth stage (i.e., a stage ST(i−4)) and may provide the output signal Gout(i−4) of the previous fourth stage to a first node Q.

The third TFT T3 may include a gate terminal connected to a second node QB, a first terminal connected to the first node Q, and a second terminal which receives the second driving voltage VSS. That is, the third TFT T3 may be turned on based on a voltage of the second node QB and may discharge the voltage of the first node Q to the second driving voltage VSS. Here, a voltage of the second node QB may be a voltage opposite to the voltage of the first node Q. For example, when a voltage of the first node Q has a high level, a voltage of the second node QB may have a low level, and vice versa.

The thirty-first TFT T31 may include a gate terminal which receives an output signal Gout5 of the fifth stage ST5 or an output signal of a next fourth stage, a first terminal connected to the first node Q, and a second terminal which receives the second driving voltage VSS. That is, the thirty-first TFT T31 may be turned on based on the output signal Gout5 of the fifth stage ST5 and may discharge the voltage of the first node Q to the second driving voltage VSS.

According to an embodiment, a thirty-first TFT T31 of a j$^{th}$ stage STj (where j is a natural number from one to 2n−4) may be turned on based on an output signal Gout(j+4) of a next fourth stage (i.e., a stage ST(j+4)) and may discharge a voltage of a first node Q to the second driving voltage VSS. Also, a thirty-first TFT T31 of each of 2n−3$^{th}$ to 2$^{th}$ stages ST(2n−3) to ST2n may be turned on by first to fourth reset clocks and may discharge a voltage of a first node Q to the second driving voltage VSS.

As described above, a plurality of stages of the gate driver 300 may each include a third TFT T3 and a thirty-first TFT T31, and thus, may include a plurality of routes through which the voltage of the first node Q is discharged. Accordingly, a discharging characteristic of the voltage of the first node Q may be enhanced, thereby enhancing the reliability of the gate driver 300.

The fourth TFT T4 may include a gate terminal which receives the first driving voltage VDD, a first terminal which receives the first driving voltage VDD, and a second terminal connected to the second node QB. That is, the fourth TFT T4 may be turned on based on the first driving voltage VDD and may provide the first driving voltage VDD to the second node QB.

The fifty-first TFT T51 may include a gate terminal which receives the first gate start signal Vst1, a first terminal connected to the second node QB, and a second terminal connected to the second driving voltage VSS. That is the fifty-first TFT T51 may be turned on based on the first gate start signal Vst1 and may discharge the voltage of the second node QB to the second driving voltage VSS.

According to an embodiment, fifty-first TFTs T51 of the second to fourth stages ST2 to ST4 may be respectively turned on based on second to fourth gate start signals Vst2 to Vst4 and may each discharge a voltage of a second node QB to the second driving voltage VSS. Also, a fifty-first TFT T51 of an $i^{th}$ stage STi (where i is a natural number from five to 2n) may be turned on based on an output signal Gout(i−4) of a previous fourth stage (i.e., a stage ST(i−4)) and may discharge a voltage of a second node QB to the second driving voltage VSS.

The fifty-second TFT T52 may include a gate terminal connected to the first node Q, a first terminal connected to the second node QB, and a second terminal connected to the second driving voltage VSS. That is, the fifty-second TFT T52 may be turned on based on the voltage of the first node Q and may discharge the voltage of the second node QB to the second driving voltage VSS.

As described above, the plurality of stages ST1 to ST2n of the gate driver 300 may each include a fifty-first TFT T51 and a fifty-second TFT T52, and thus, may include a plurality of routes through which the voltage of the first node Q is discharged. Accordingly, a discharging characteristic of the voltage of the second node QB may be enhanced, thereby enhancing the reliability of the gate driver 300.

The sixth TFT T6 may include a gate terminal connected to the first node Q, a first terminal which receives a first gate clock CLK1, and a second terminal connected to an output node. That is, the sixth TFT T6 may be turned on based on the voltage of the first node Q and may provide an output signal (or a gate pulse) Gout1 to the first gate line GL1. Also, the output signal Gout1 may be supplied as a gate start signal of a next fourth stage.

The seventh TFT T7 may include a gate terminal connected to the second node QB, a first terminal connected to an output node, and a second terminal connected to the second driving voltage VSS. That is, the seventh TFT T7 may be turned on based on the voltage of the second node QB and may discharge a voltage of the output node to the second driving voltage VSS.

Moreover, one end of the boot capacitor CB may be connected to the first node Q, and the other end of the boot capacitor CB may be connected to the output node. Accordingly, the boot capacitor CB may store a difference voltage between the first node Q and the output node.

Hereinafter, an operation of a first stage ST1 according to an embodiment of the present disclosure will be described with reference to FIGS. 6 and 7.

First, when a first gate start signal Vst1 has a high level, a first TFT T1 and a fifty-first TFT T51 of a first stage ST1 may be turned on. Therefore, a voltage VQ1 of a first node Q which is one end of a boot capacitor CB may be pre-charged with a first driving voltage VDD supplied through the first TFT T1, and a voltage of a second node QB may be discharged to a second driving voltage VSS through the fifty-first TFT T51. Here, a rising time of a first gate clock CLK1 may be delayed by four horizontal periods compared to a rising time of the first gate start signal Vst1, and the first gate start signal Vst1 may maintain a high level until before the rising time of a first gate clock CLK1. Therefore, a sixth TFT T6 may be turned on based on the first gate start signal Vst1 which has a high level and is charged into the first node Q and may provide the first gate clock CLK1 having a low level to a first gate line GL1 through an output node. At this time, the voltage of the second node QB may be discharged to the second driving voltage VSS through each of the fifty-first TFT T51 and a fifty-second TFT T52, and a seventh TFT T7 may maintain a turn-off state.

Subsequently, when the first gate start signal Vst1 has a low level and the first gate clock CLK1 has a high level, the first gate clock CLK1 may be applied to the output node, which is the other end of the boot capacitor CB, through the sixth TFT T6 which is still in a turn-on state. Therefore, the first node Q which is the one end of the boot capacitor CB may be bootstrapped to have a high-level voltage which is higher. Accordingly, the sixth TFT T6 may be put in a complete turn-on state and may provide the first gate clock CLK1 to the first gate line GL1 as a first gate pulse Gout1 without the loss of a voltage. At this time, the voltage of the second node QB may be discharged to the second driving voltage VSS through the fifty-second TFT T52, and the seventh TFT T7 may maintain a turn-off state.

Finally, when an output signal Vout5 having a high level is supplied from a fifth stage ST5 or a next fourth stage to a gate terminal of a thirty-first TFT T31, the thirty-first TFT T31 may be turned on and may discharge the voltage VQ1 of the first node Q1 to the second driving voltage VSS. Therefore, the sixth TFT T6 may be turned off and may not provide the first gate clock CLK1 to the output node, and the fifty-second TFT T52 may be turned off and may not discharge the voltage of the second node QB to the second driving voltage VSS. Accordingly, the voltage of the second node QB may have a high level on the basis of the first driving voltage VDD supplied through the fourth TFT T4, and the seventh TFT T7 may be turned on and may discharge a voltage of the output node to the second driving voltage VSS. As a result, when the voltage of the output node is discharged to the second driving voltage VSS, the first stage ST1 may supply a gate-off voltage to the first gate line GL1.

Moreover, except for that the above-given descriptions (for example, second to fourth gate start signals Vst2 to Vst4 and first to fourth clocks), a configuration and an operation of each of second to $2^{th}$ stages ST2 to ST2n are the same as the above-described first stage ST1, and thus, their descriptions are omitted.

Figure 8:
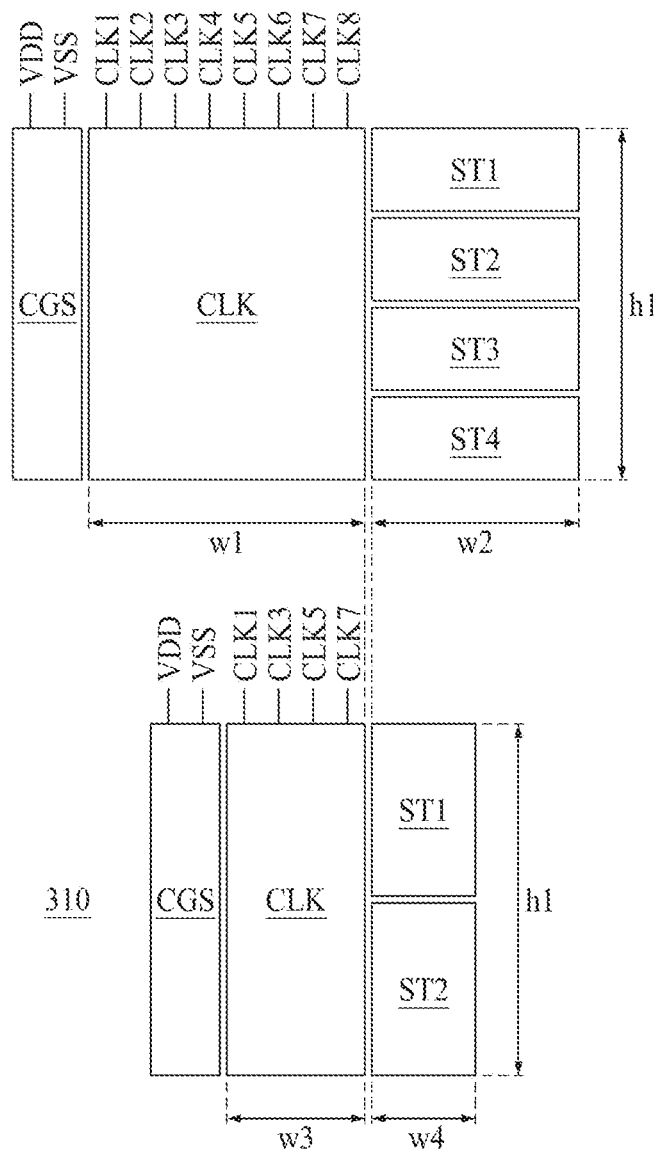
FIG. 8 is a diagram for describing an effect of decreasing a bezel area in the display apparatus illustrated in FIG. 2 according to an embodiment.
Figure 9:
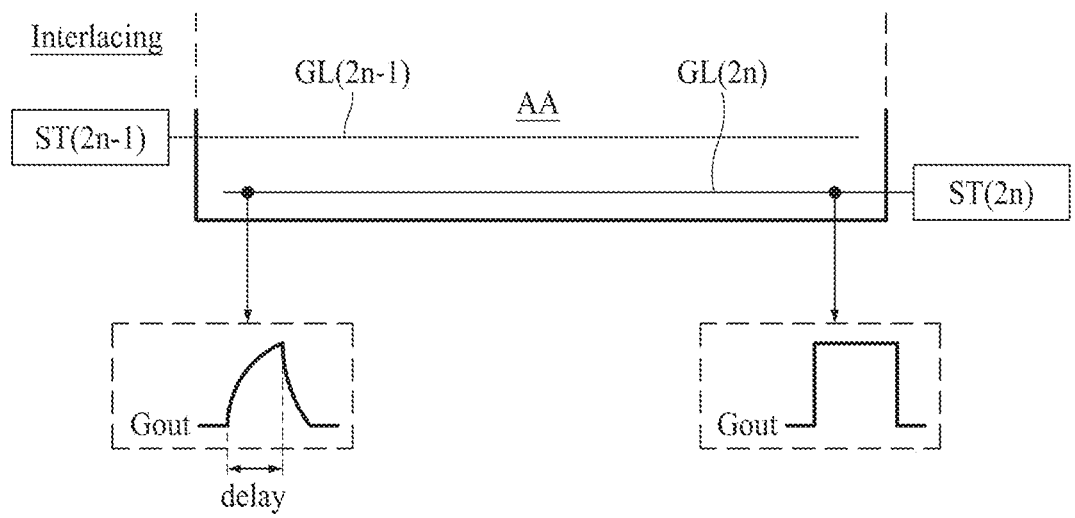
FIG. 9 is a diagram for describing an effect of decreasing the delay of a gate pulse in the display apparatus illustrated in FIG. 2.
Figure 9:
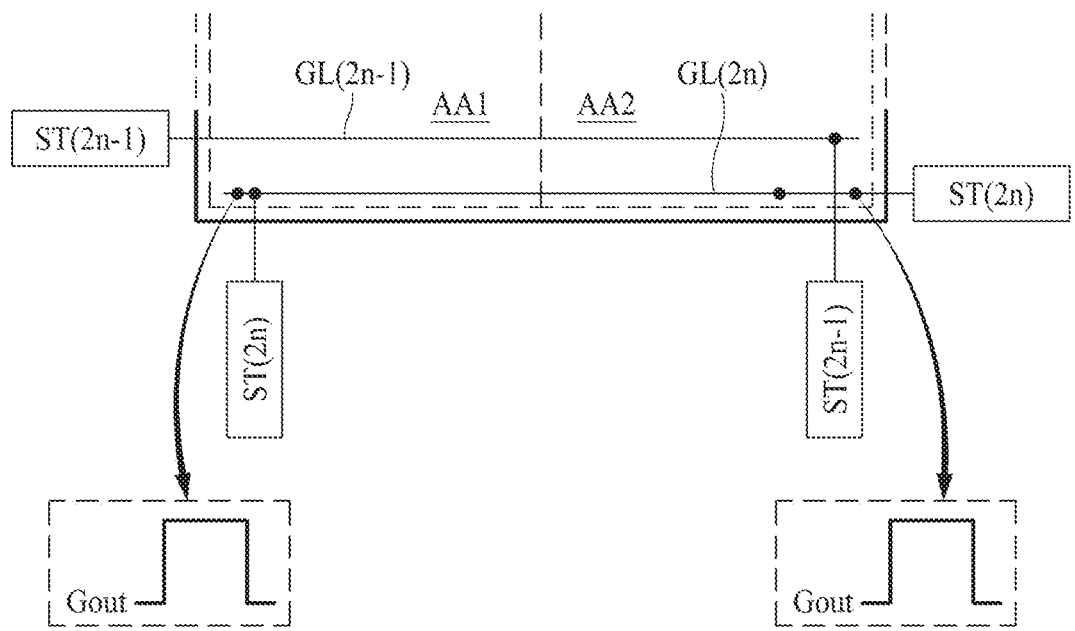

FIG. 8 is a diagram for describing an effect of decreasing a bezel area in the display apparatus illustrated in FIG. 2. FIG. 9 is a diagram for describing an effect of decreasing the delay of a gate pulse in the display apparatus illustrated in FIG. 2.

Referring to FIGS. 8 and 9, in a related art display apparatus having a large display panel, a gate pulse is supplied to a plurality of gate lines by using a double feeding method or an interlacing method.

In FIG. 8, in a related art display apparatus driven by the double feeding method, a plurality of stages are disposed in each of a left bezel area and a right bezel area of a substrate. In this case, the related art display apparatus has a problem where the left bezel area and the right bezel area increase due to a width w1 of a clock line CLK including first to eighth gate clocks CLK1 to CLK8 and a width w2 of each of the plurality of stages. The related art display apparatus has a problem where a bezel area increases as a gate driver is driven at a high speed (or a high frequency).

In order to solve such a problem, in a display apparatus 10 according to the present disclosure, odd stages ST1 to ST(2n−1) of a first gate driving circuit 310 may be disposed in a left edge (or a second non-display area NA2) of a display panel 100, even stages ST2 to ST(2n) of a second gate driving circuit 320 may be disposed in a right edge (or a third non-display area NA3) of the display panel 100, and odd stages ST1 to ST(2n−1) and even stages ST2 to ST(2n) of a third gate driving circuit 330 may be disposed in a lower edge (or a fourth non-display area NA4) of the display panel 100. Accordingly, in the first gate driving circuit 310, a width w3 of a clock line CLK including first, third, fifth, and seventh gate clocks CLK1, CLK3, CLK5, and CLK7 and a width w4 of each of the odd stages ST1 to ST(2n−1) may decrease compared to the related art display apparatus.

For example, in the related art display apparatus driven by the double feeding method, a second width w2 increases in order for first to fourth stages ST1 to ST4 to be provided in a certain interval h1. On the other hand, in the first gate driving circuit 310 according to the present disclosure, the width w4 of each of the odd stages ST1 and ST3 may be reduced by decreasing the number of stages provided in the certain interval h1. Accordingly, in the first gate driving circuit 310 according to the present disclosure, since only the odd stage ST1 and ST3 are provided in the certain interval h1, a bezel area may decrease even in a case which drives a large display panel.

In FIG. 9, in a related art display apparatus driven by the interlacing method, an odd-numbered stage ST(2n−1) of the plurality of stages is disposed in the left bezel area of the substrate, and an even-numbered stage ST(2n) of the plurality of stages is disposed in the right bezel area of the substrate. In this case, the related art display apparatus including a large display panel has a problem where a gate clock Gout is delayed as a gate line GL(2n) becomes farther away from a stage. Therefore, in the related art display apparatus, an output difference between one end of the gate line GL(2n) directly receiving a gate clock from a stage and the other end of the gate line GL(2n) farther away from the stage occurs. Also, in the related art display apparatus, delay occurs in the gate clock Gout, causing a problem where an image defect occurs in high speed driving (or high frequency driving)

In order to solve such a problem, in the display apparatus 10 according to the present disclosure, odd stages ST1 to ST(2n−1) of the first gate driving circuit 310 may be disposed in one end of a first display area AA1, and odd stages ST1 to ST(2n−1) of the third gate driving circuit 330 may be disposed in the other end of a second display area AA2. Also, in the display apparatus 10 according to the present disclosure, even stages ST2 to ST(2n) of the second gate driving circuit 320 may be disposed in one end of the second display area AA2, and even stages ST2 to ST(2n) of the third gate driving circuit 330 may be disposed in the other end of the first display area AA1.

Therefore, the odd stages ST1 to ST(2n−1) of the first gate driving circuit 310 may directly supply a gate pulse to one ends of odd gate lines GL1 to GL(2n−1), and the odd stages ST1 to ST(2n−1) of the third gate driving circuit 330 may supply the gate pulse to points of the odd gate lines GL1 to GL(2n−1) of the second display area AA2 through a first connection line CL1. In this manner, the even stages ST2 to ST(2n) of the second gate driving circuit 320 may directly supply the gate pulse to one ends of even gate lines GL2 to GL(2n), and the even stages ST2 to ST(2n) of the third gate driving circuit 330 may supply the gate pulse to points of the even gate lines GL2 to GL(2n) of the first display area AA1 through a second connection line CL2.

Therefore, the display apparatus 10 according to the present disclosure may prevent delay from occurring in the gate clock Gout, thereby preventing an output difference from occurring between both ends of the gate line GL(2n). Accordingly, the display apparatus 10 according to the present disclosure may prevent delay from occurring in high speed driving (or high frequency driving), and thus, may easily perform the high-speed driving of a large display panel, thereby enhancing image quality.

As a result, since the display apparatus 10 according to the present disclosure includes the first to third gate driving circuits 310 to 330, the left bezel area and the right bezel area may be reduced, and the delay of the gate pulse may not occur, thereby easily realizing high speed driving. In other words, in the display apparatus 10 according to the present disclosure, since the first to third gate driving circuits 310 to 330 are individually and respectively disposed in the second to fourth non-display areas NA2 to NA4 except the first non-display area NA1 with the pad part provided therein, an area of each of the second and third non-display areas NA2 and NA3 may be reduced, and an output difference between gate pulses may be prevented from occurring in the display area AA.

Figure 10:
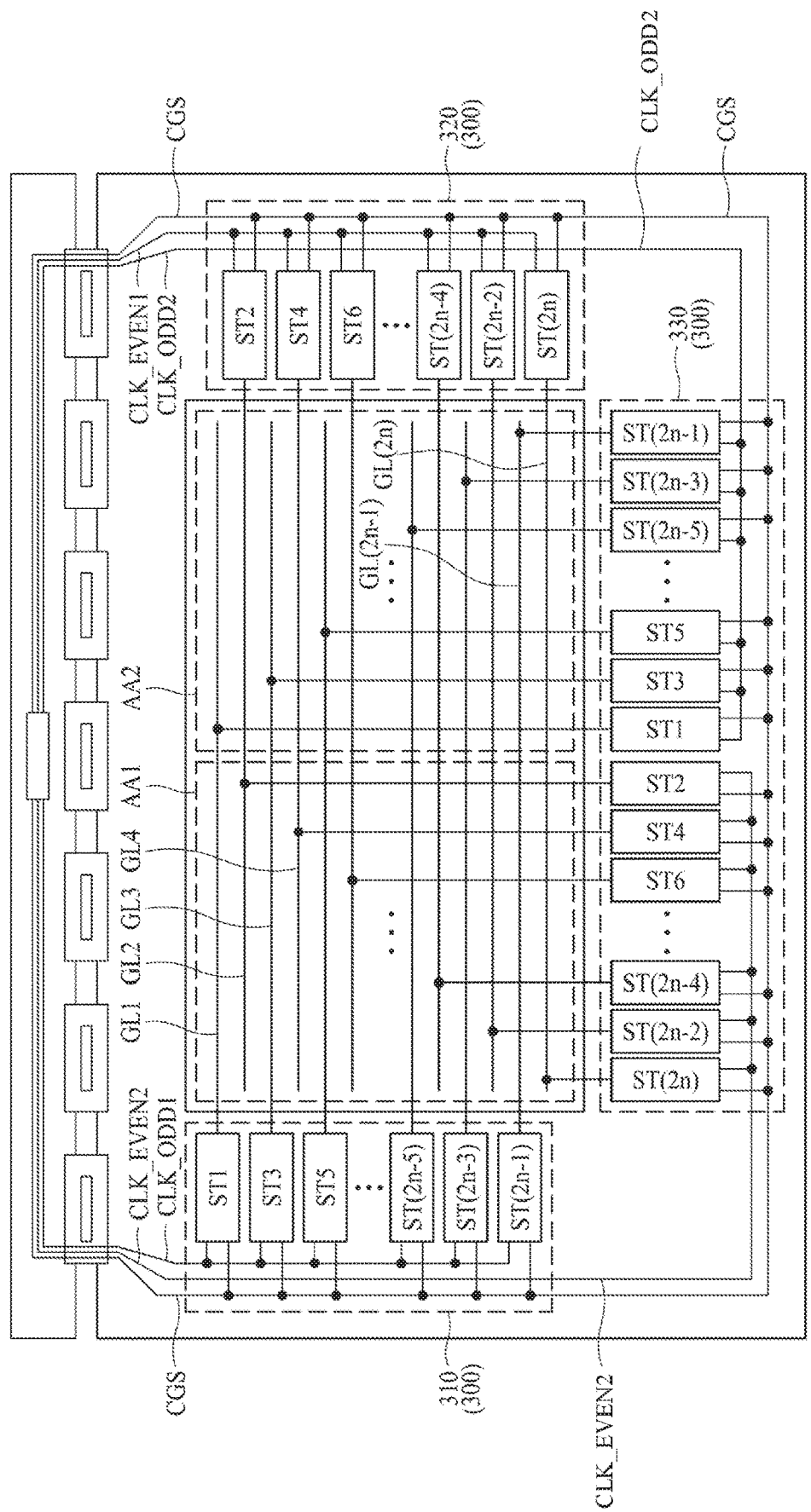
FIG. 10 is a diagram illustrating a connection relationship between a plurality of stages and a plurality of gate lines in a display apparatus according to another embodiment.
Figure 11:
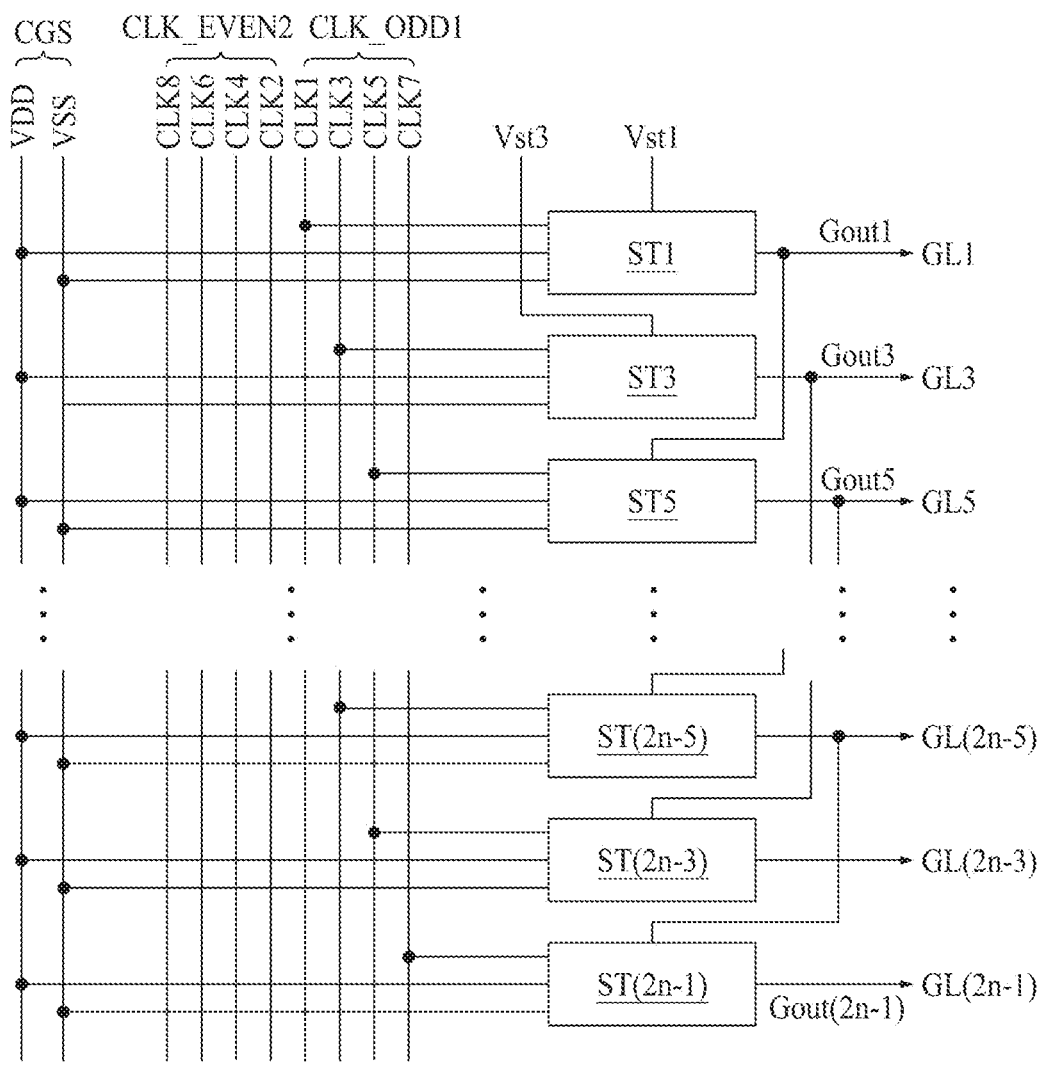
FIG. 11 is a diagram illustrating a first gate driving circuit in the display apparatus illustrated in FIG. 10 according to an embodiment.
Figure 12:
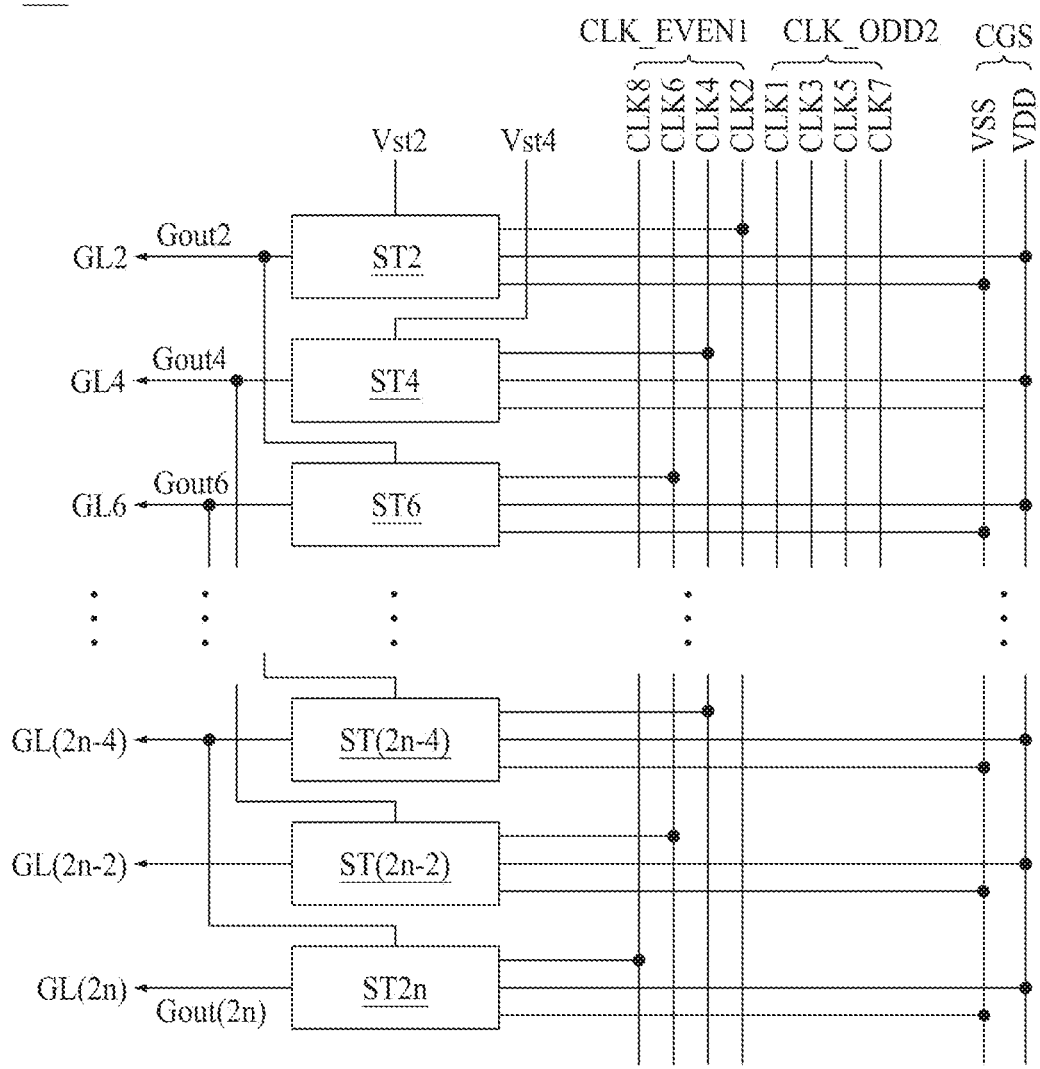
FIG. 12 is a diagram illustrating a second gate driving circuit in the display apparatus illustrated in FIG. 10 according to an embodiment.
Figure 13:
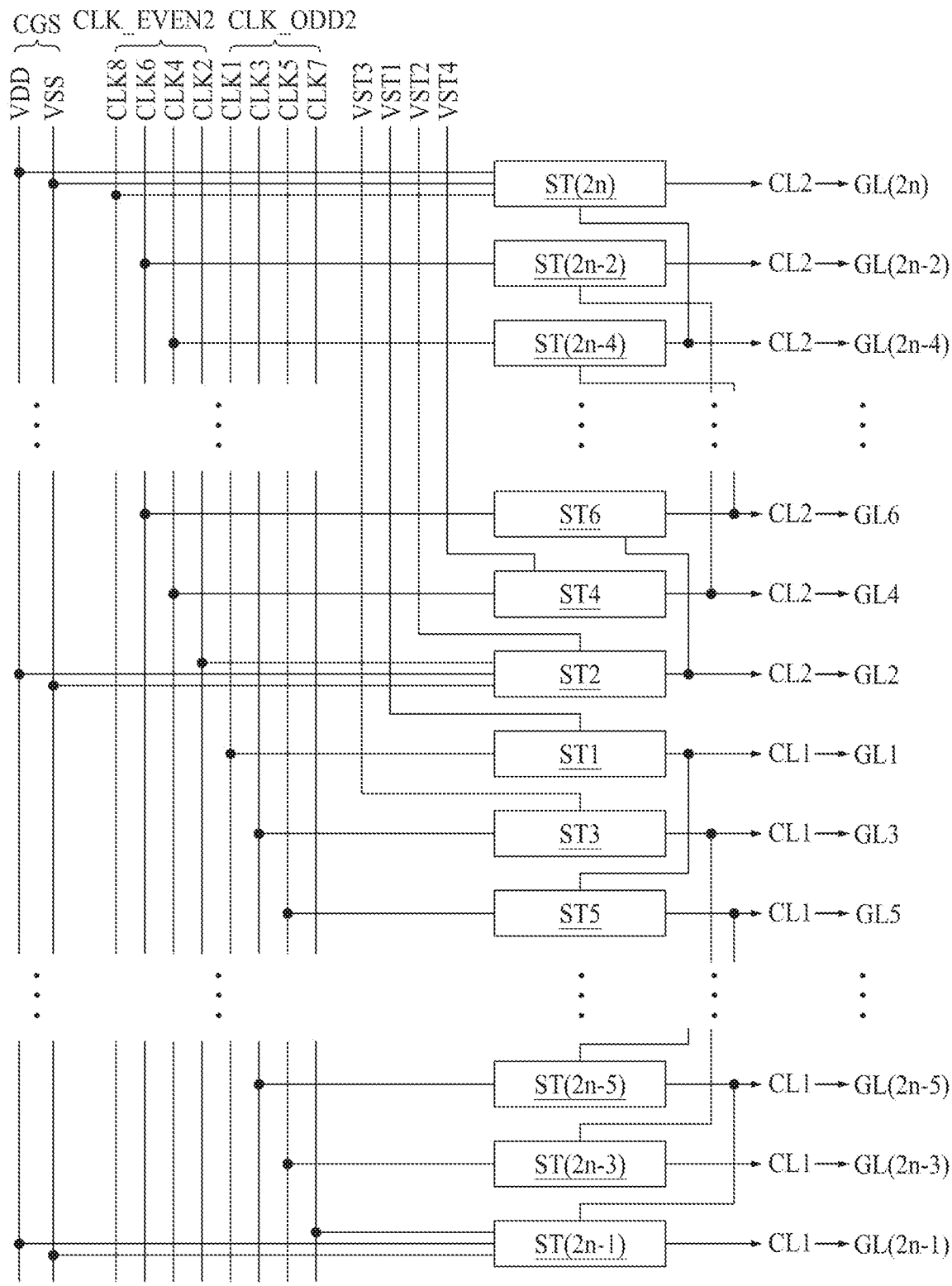
FIG. 13 is a diagram illustrating a third gate driving circuit in the display apparatus illustrated in FIG. 10 according to an embodiment.

FIG. 10 is a diagram illustrating a connection relationship between a plurality of stages and a plurality of gate lines in a display apparatus according to another embodiment. FIG. 11 is a diagram illustrating a first gate driving circuit in the display apparatus illustrated in FIG. 10. FIG. 12 is a diagram illustrating a second gate driving circuit in the display apparatus illustrated in FIG. 10. FIG. 13 is a diagram illustrating a third gate driving circuit in the display apparatus illustrated in FIG. 10. Here, a display apparatus according to another embodiment illustrated in FIGS. 10 to 13 may be implemented by modifying only configurations of first and second odd clock lines CLK_ODD1 and CLK_ODD2 and first and second even clock lines CLK_EVEN1 and CLK_EVEN2, and thus, the same configuration as the above-described configuration will be briefly described or be omitted.

Referring to FIGS. 10 to 13, the first odd clock line CLK_ODD1 may extend from a display driver 200 to a second non-display area NA2 and may be connected to odd stages ST1 to ST(2n−1) of a first gate driving circuit 310.

The second odd clock lines CLK_ODD2 may pass through a third non-display area NA3 and may extend from the display driver 200 to a fourth non-display area NA4 and may be connected to odd stages ST1 to ST(2n−1) of a third gate driving circuit 330.

The first even clock line CLK_EVEN1 may extend from the display driver 200 to the third non-display area NA3 and may be connected to even stages ST2 to ST(2n) of a second gate driving circuit 320.

The second even clock lines CLK_EVEN2 may pass through the second non-display area NA2 and may extend from the display driver 200 to the third non-display area NA3 and may be connected to even stages ST2 to ST(2n) of a third gate driving circuit 330.

As described above, since the display apparatus 10 shown in FIG. 10 is implemented by modifying a configuration of each clock line of the display apparatus shown in FIG. 2, a load of each clock line may be reduced, and the first to eighth gate clocks CLK1 to CLK8 may be easily transferred to each stage of the gate driver 300.

Figure 14:
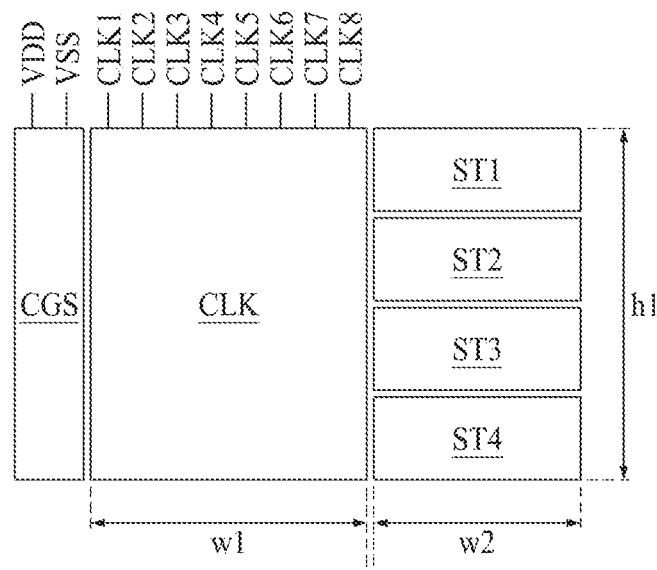
FIG. 14 is a diagram for describing an effect of decreasing a bezel area in the display apparatus illustrated in FIG. 10.
Figure 14:
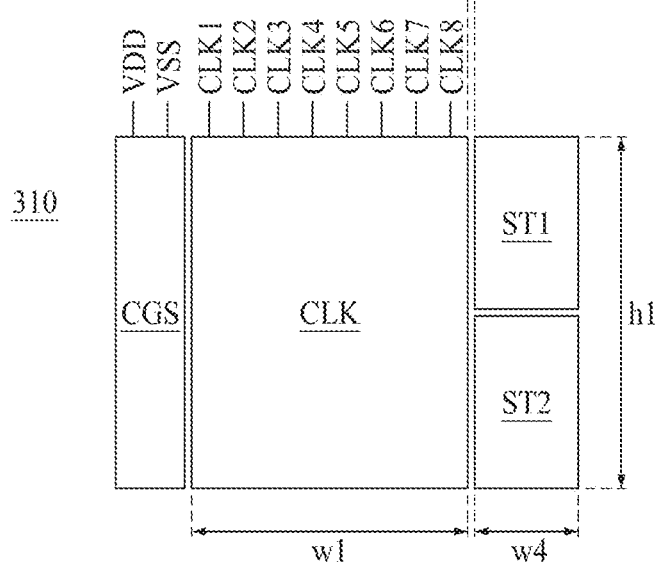

FIG. 14 is a diagram for describing an effect of decreasing a bezel area in the display apparatus illustrated in FIG. 10.

Referring to FIG. 14, in the related art display apparatus driven by the double feeding method, a plurality of stages are disposed in each of a left bezel area and a right bezel area of a substrate. In this case, the related art display apparatus has a problem where the left bezel area and the right bezel area increase due to a width w1 of a clock line CLK including first to eighth gate clocks CLK1 to CLK8 and a width w2 of each of the plurality of stages. The related art display apparatus has a problem where a bezel area increases as a gate driver is driven at a high speed (or a high frequency).

In order to solve such a problem, in a display apparatus 10 according to the present disclosure, odd stages ST1 to ST(2n−1) of a first gate driving circuit 310 may be disposed in a left edge (or a second non-display area NA2) of a display panel 100, even stages ST2 to ST(2n) of a second gate driving circuit 320 may be disposed in a right edge (or a third non-display area NA3) of the display panel 100, and odd stages ST1 to ST(2n−1) and even stages ST2 to ST(2n) of a third gate driving circuit 330 may be disposed in a lower edge (or a fourth non-display area NA4) of the display panel 100. Accordingly, in the first gate driving circuit 310, a width w4 of each of the odd stages ST1 to ST(2n−1) may decrease compared to the related art display apparatus.

As a result, since the display apparatus 10 according to the present disclosure includes the first to third gate driving circuits 310 to 330, the left bezel area and the right bezel area may be reduced, and the delay of the gate pulse may not occur, thereby easily realizing high speed driving. In other words, in the display apparatus 10 according to the present disclosure, since the first to third gate driving circuits 310 to 330 are individually and respectively disposed in the second to fourth non-display areas NA2 to NA4 except the first non-display area NA1 with the pad part provided therein, an area of each of the second and third non-display areas NA2 and NA3 may be reduced, and an output difference between gate pulses may be prevented from occurring in the display area AA.

Moreover, when the display panel 100 is a liquid crystal display panel, a TFT substrate including TFTs may be exposed at the outside of the display apparatus 10, and thus, a width of a case cover which covers or supports the first to fourth non-display areas may be reduced.

Generally, for example, a pad part provided in the first non-display area may be provided on the TFT substrate, an upper substrate facing to the TFT substrate may be bonded to the TFT substrate with a liquid crystal therebetween, a printed circuit board (PCB) may be connected to the pad part in the TFT substrate and may be disposed at the back side of the upper substrate, and the upper substrate may be exposed to the outside of the display apparatus. That is, a user who uses the display apparatus may see an image displayed through the upper substrate. In this case, since the pad part should be exposed, a size of the upper substrate may be implemented to be less than that of the TFT substrate. Therefore, the pad part may also be exposed in a direction capable of being seen by the user, and thus, the pad part may be covered by the case cover so as not to be seen by the user. Accordingly, according to the present disclosure, even when an area of each of the second to fourth non-display areas is reduced, an area of the first non-display area may not decrease, and particularly, a width of a case cover which covers the first non-display area may not be reduced.

However, when the TFT substrate is disposed in an internal direction (i.e., a direction toward a backlight unit) of the display apparatus 10 and the upper substrate is provided in an external direction (i.e., a direction seen by the user) of the display apparatus 10, a width of the case cover which covers or supports the first non-display area may be reduced.

That is, according to the above-described arrangement structure according to the present disclosure, even when a size of the first non-display area is not substantially reduced, the pad part may not be exposed in the external direction of the display apparatus 10, and thus, a width of the case cover for covering the first non-display area with the pad part provided therein may decrease. In this case, according to the present disclosure, since an area of each of the second and third non-display areas is reduced, a width of each of case covers which respectively cover or support the second and third non-display areas may be reduced. Accordingly, according to the present disclosure, a width of each of case covers which respectively cover or support the first to fourth non-display areas may be reduced.

In the display apparatus according to the present disclosure, since a gate driving circuit is disposed in a non-display area provided in each of three sides except a pad part, a left bezel area and a right bezel area may be reduced, and the delay of a gate pulse is prevented, thereby easily realizing high speed driving.

Moreover, in the display apparatus according to the present disclosure, since the gate driving circuit is individually disposed in each of second to fourth non-display areas except a first non-display area with the pad part provided therein, an area of each of the second and third non-display areas may be reduced, and an output difference between gate pulses is prevented from occurring in a display area.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a first substrate including a display area, including pixels connected to a plurality of gate lines, and first to fourth non-display areas surrounding the display area;
a first gate driving circuit disposed in the second non-display area to drive a first gate line group among the plurality of gate lines;
a second gate driving circuit disposed in the third non-display area to drive a second gate line group among the plurality of gate lines;
a third gate driving circuit disposed in the fourth non-display area to drive the first gate line group and the second gate line group,
an odd clock line extending to the fourth non-display area via the second non-display area, the odd clock line configured to provide an odd clock signal to an odd stage of the first gate driving circuit and an odd stage of the third gate driving circuit; and an even clock line extending to the fourth non-display area via the third non-display area, the even clock line configured to provide an even clock signal to an even stage of the second gate driving circuit and an even stage of the third gate driving circuit,
wherein the display area comprises:
a first display area adjacent to the first gate driving circuit; and
a second display area adjacent to the second gate driving circuit,
the even stage of the third gate driving circuit in the fourth non-display area is adjacent to the first gate driving circuit and is connected to the second gate line group in the first display area, and
the odd stage of the third gate driving circuit in the fourth non-display area is adjacent to the second gate driving circuit and is connected to the first gate line group in the second display area.

2. The display apparatus of claim 1, wherein the second non-display area and the third non-display area are located at opposite sides of the display apparatus.

3. The display apparatus of claim 1, further comprising:
a common signal line passing through the second non-display area, the third non-display area and the fourth non-display area to supply a common gate signal to the first gate driving circuit, the second gate driving circuit and the third gate driving circuit.

4. The display apparatus of claim 1, wherein
the first gate line group comprises an odd gate line, and
the odd stage of the first gate driving circuit corresponds to the odd gate line.

5. The display apparatus of claim 1, wherein
the second gate line group comprises an even gate line, and
the even stage of the second gate driving circuit corresponds to the even gate line.

6. The display apparatus of claim 1, wherein the odd stage of the third gate driving circuit corresponds to the first gate line group and the even stage of the third gate driving circuit corresponds to the second gate line group.

7. The display apparatus of claim 6, further comprising:
a first connection line connecting the odd stage of the third gate driving circuit to the first gate line group; and
a second connection line connecting the even stage of the third gate driving circuit to the second gate line group.

8. The display apparatus of claim 7, wherein a length of each of the first connection line and the second connection line gradually decreases from a middle portion of the third gate driving circuit to an edge portion of the third gate driving circuit in the first substrate.

9. The display apparatus of claim 7, wherein the plurality of gate lines extend in a first direction, and the first and second connection lines extend in a second direction perpendicular to the first direction.

10. The display apparatus of claim 1, further comprising:
a pad part disposed in the first non-display area.

11. The display apparatus of claim 10, further comprising:
a thin film transistor (TFT) disposed in the display area, the TFT including a gate electrode, an active layer, a source electrode and a drain electrode.

12. The display apparatus of claim 11, wherein the active layer of the TFT includes one of an oxide semiconductor layer, an amorphous silicon semiconductor layer, and a polycrystalline semiconductor layer.

13. The display apparatus of claim 11, further comprising:
a color filter disposed over the TFT with an insulation layer interposed therebetween.

14. The display apparatus of claim 11, further comprising:
a color filter disposed over the TFT; and
a planarization layer disposed on the color filter.

15. The display apparatus of claim 1, wherein the first gate driving circuit faces one end of the first display area, and an even stage of the third gate driving circuit faces another end of the first display area that is perpendicular to the one end of the first display area.

16. The display apparatus of claim 1, wherein the second gate driving circuit faces one end of the second display area, and an odd stage of the third gate driving circuit faces another end of the second display area that is perpendicular to the one end of the second display area.

17. The display apparatus of claim 1, wherein the first gate driving circuit supplies a gate pulse to one end of an odd gate line extending towards the third non-display area, and the third gate driving circuit is connected to the odd gate line in the second display area to supply the gate pulse to the connected odd gate line.

18. The display apparatus of claim 1, wherein the second gate driving circuit supplies a gate pulse to one end of an even gate line extending towards the third non-display area, and the third gate driving circuit is connected to the even gate line in the first display area to supply the gate pulse to the connected even gate line.

19. The display apparatus of claim 1, further comprising:
first and second connection lines connecting the third gate driving circuit to the first gate line group and the second gate line group, respectively.

20. The display apparatus of claim 19, wherein the first and second connection lines are disposed on one of a planarization layer and a color filter.

21. The display apparatus of claim 19, wherein the first and second connection lines are disposed under a TFT.

22. A display apparatus comprising:
a first substrate including a display area, including pixels connected to a plurality of gate lines, and first to fourth non-display areas surrounding the display area;
a first gate driving circuit disposed in the second non-display area to drive a first gate line group among the plurality of gate lines;
a second gate driving circuit disposed in the third non-display area to drive a second gate line group among the plurality of gate lines;
a third gate driving circuit disposed in the fourth non-display area to drive the first gate line group and the second gate line group,
a first odd clock line disposed in the second non-display area to provide an odd clock signal to an odd stage of the first gate driving circuit;
a second odd clock line extending to the fourth non-display area via the third non-display area to provide an odd clock signal to an odd stage of the third gate driving circuit;
a first even clock line disposed in the third non-display area to provide an even clock signal to an even stage of the second gate driving circuit; and
a second even clock line extending to the fourth non-display area via the second non-display area to provide an even clock signal to an even stage of the third gate driving circuit,
wherein the display area comprises:
a first display area adjacent to the first gate driving circuit; and
a second display area adjacent to the second gate driving circuit, the even stage of the third gate driving circuit in the fourth non-display area is adjacent to the first gate driving circuit and is connected to the second gate line group in the first display area, and the odd stage of the third gate driving circuit in the fourth non-display area is adjacent to the second gate driving circuit and is connected to the first gate line group in the second display area.

23. A display apparatus comprising:

a first substrate including a display area, including pixels connected to a plurality of gate lines, and first to fourth non-display areas surrounding the display area, wherein the plurality of gate lines are arranged in a first gate line group and a second gate line group;

a first gate driving circuit disposed in the second non-display area and connected to the first gate line group but not the second gate line group, the first gate driving circuit configured to drive the first gate line group;

a second gate driving circuit disposed in the third non-display area and connected to the second gate line group but not the first gate line group, the second gate driving circuit configured to drive the second gate line group;

a third gate driving circuit disposed in the fourth non-display area connected to both the first gate line group and the second gate line group to respectively drive the first gate line group and the second gate line group, an odd clock line extending to the fourth non-display area via the second non-display area, the odd clock line configured to provide an odd clock signal to an odd stage of the first gate driving circuit and an odd stage of the third gate driving circuit; and an even clock line extending to the fourth non-display area via the third non-display area, the even clock line configured to provide an even clock signal to an even stage of the second gate driving circuit and an even stage of the third gate driving circuit.

24. The display apparatus of claim 23, wherein the second non-display area and the third non-display area are located at opposite sides of the display apparatus.

25. The display apparatus of claim 23, wherein the first gate line group comprises odd gate lines from the plurality of gate lines and the second gate line group comprises even gate lines from the plurality of gate lines.

26. The display apparatus of claim 23, wherein the odd stage of the third gate driving circuit is connected to the first gate line group but not the second gate line group and the even stage of the third gate driving circuit is connected to the second gate line group but not the first gate line group.

* * * * *